US012744300B2

(12) United States Patent
Kim et al.

(10) Patent No.: US 12,744,300 B2
(45) Date of Patent: Sep. 22, 2026

(54) TRANSITION STRUCTURES FOR ULTRAHIGH SPEED DIGITAL SIGNAL TRANSMISSION, AND DIGITAL TRANSMISSION LINE INCLUDING SAME

(71) Applicant: Kyungpook National University Industry-Academic Cooperation Foundation, Daegu (KR)

(72) Inventors: Kang Wook Kim, Daegu (KR); Gwan Hui Lee, Daegu (KR); Jung Seok Lee, Namyangju-si (KR); Byung Cheol Min, Daegu (KR)

(73) Assignee: Kyungpook National University Industry-Academic Cooperation Foundation, Daegu (KR)

( * ) Notice: Subject to any disclaimer, the term of this patent is extended or adjusted under 35 U.S.C. 154(b) by 132 days.

(21) Appl. No.: 18/702,747

(22) PCT Filed: Sep. 2, 2022

(86) PCT No.: PCT/KR2022/013168
§ 371 (c)(1),
(2) Date: Apr. 18, 2024

(87) PCT Pub. No.: WO2023/068540
PCT Pub. Date: Apr. 27, 2023

(65) Prior Publication Data

US 2025/0233297 A1 Jul. 17, 2025

(30) Foreign Application Priority Data

Oct. 18, 2021 (KR) ........................ 10-2021-0138269

(51) Int. Cl.
*H01P 5/02* (2006.01)
*H01P 7/08* (2006.01)
(Continued)

(52) U.S. Cl.
CPC .............. *H01P 7/082* (2013.01); *H01P 5/028* (2013.01); *H01P 7/10* (2013.01); *H05K 1/0245* (2013.01)

(58) Field of Classification Search
CPC .. H01P 5/028; H01P 5/022; H01P 5/02; H01P 3/02; H01P 3/08; H01P 3/081;
(Continued)

(56) References Cited

U.S. PATENT DOCUMENTS 8,174,336 B2 5/2012 Kim et al.
2007/0294890 A1* 12/2007 Gisin ................ H01L 23/49827 333/260

FOREIGN PATENT DOCUMENTS

JP 2005-123894 A 5/2005
JP 2005-277028 A 10/2005
(Continued)

OTHER PUBLICATIONS

Gwan Hui Lee et al., "Design of an ultra-wideband coplanar strip-to-parallel stripline transition using an analytical model based on conformal mapping", Microwave and Optical Technology Letters, vol. 63, Issue 4, pp. 1054-1060, Published Nov. 3, 2020. (8 Pages).

(Continued)

*Primary Examiner* — Stephen E. Jones
(74) *Attorney, Agent, or Firm* — Osha Bergman Watanabe & Burton LLP

(57) ABSTRACT

The disclosure relates to transition structures for digital signal transmission and digital transmission lines including the same for transmitting digital signals at an ultra-high speed of approximately 100 Gbps. According to the present disclosure, it is possible to transmit digital signals at ultra-high speed while solving problems such as interference between lines or phase difference 180° of existing differen-
(Continued)

tial lines by connecting balanced lines to differential lines with two lines of opposite polarities using optimized transition structures of various shapes or digital transmission lines with a plurality of dielectric substrates.

16 Claims, 36 Drawing Sheets

(51) Int. Cl.
*H01P 7/10* (2006.01)
*H05K 1/02* (2006.01)

(58) Field of Classification Search
CPC . H01P 3/082; H01P 3/00; H01P 3/003; H05K 1/0245
USPC .......................................................... 333/24 R
See application file for complete search history.

(56) References Cited

FOREIGN PATENT DOCUMENTS

| | | |
|---|---|---|
| KR | 10-0771529 B1 | 10/2007 |
| KR | 10-2011-0062285 A | 6/2011 |
| KR | 10-1157825 B1 | 6/2012 |

OTHER PUBLICATIONS

Gwan Hui Lee et al., “Generalized Design Technique of Ultra-Wideband Transitions for Quasi-TEM Planar Transmission Lines Based on Analytical Models”, Open Access Journal, vol. 9, pp. 52619-52633, Published Mar. 30, 2021. (15 Pages).

* cited by examiner (a)

BB'-CC'

(b)

CC'-DD'

(c)

FIG. 17B
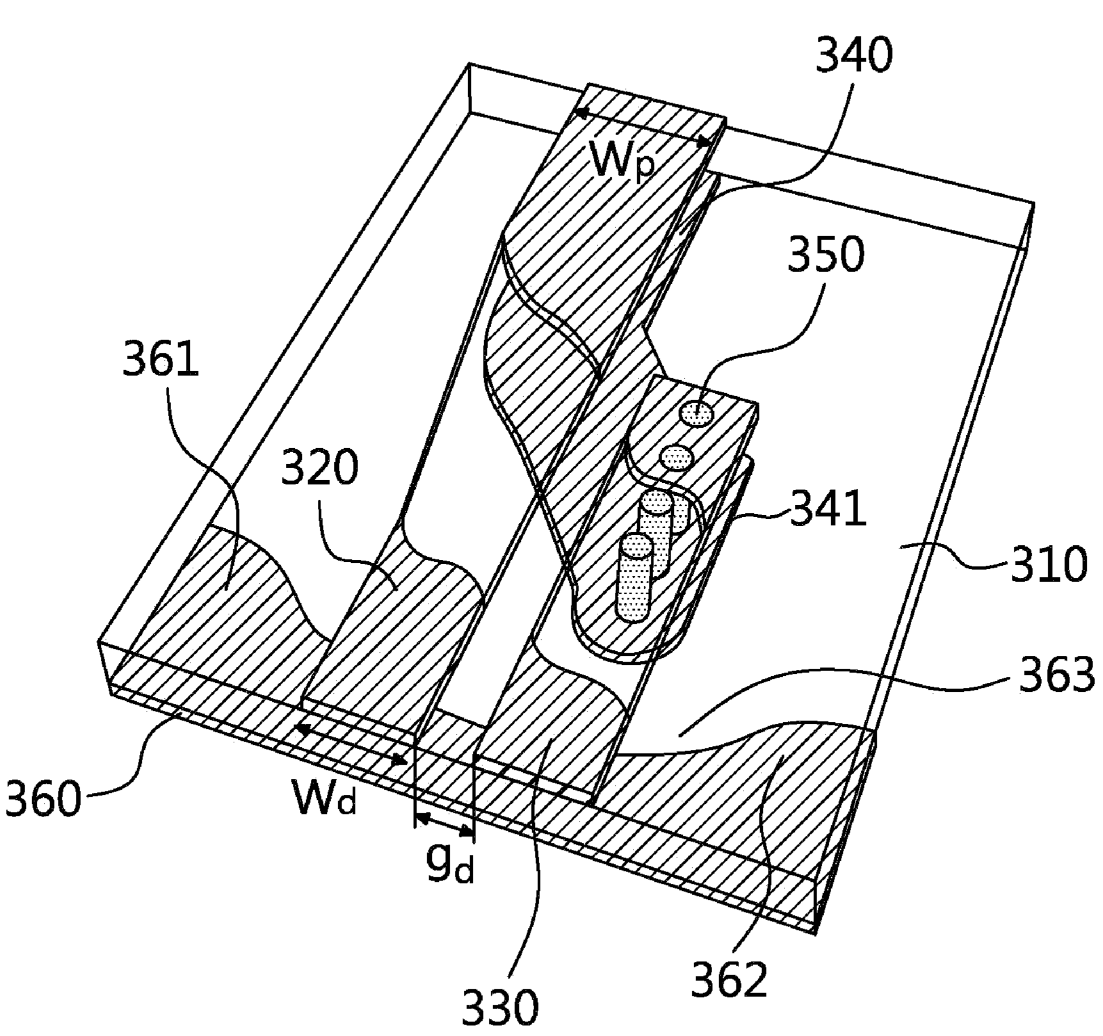

(a)

BB'-CC'

(b)

CC'

(c)

(a)

DD'-EE'

(b)

EE'-FF'

(c)

FIG. 23B
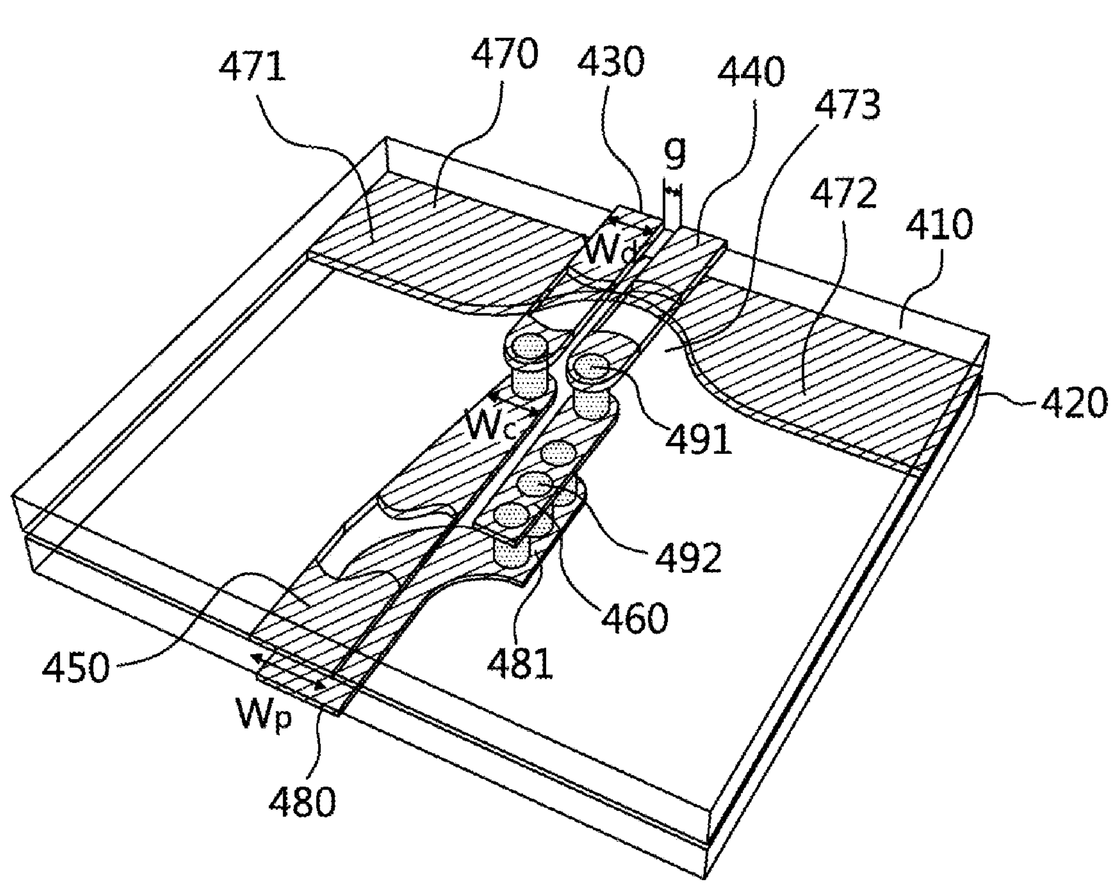

TRANSITION STRUCTURES FOR ULTRAHIGH SPEED DIGITAL SIGNAL TRANSMISSION, AND DIGITAL TRANSMISSION LINE INCLUDING SAME

TECHNICAL FIELD

The following disclosure relates to transition structures for digital signal transmission and digital transmission lines including the same which can transmit a digital signal through a circuit board at an ultra-high speed per line (approximately 100 Gbps per line).

BACKGROUND ART

Currently, in most digital circuits, transmission lines for transmitting a digital signal at a high speed adopt a differential line in which a phase difference between two lines is around 180°. However, due to a structural problem, a maximum operation frequency bandwidth of the differential line is limited. For example, in the case of the differential line, a line length difference between the two lines of the differential line can inevitably occur on an actual circuit board, and in this case, a phase unbalance between the two lines that may cause various problems is generated. Such a phase unbalance causes radiation or loss of a transmitted signal. Accordingly, in a differential line structure, a common-mode signal cannot be suppressed, and also a reflection phenomenon of a signal occurs. Further, there are problems such as a signal distortion phenomenon due to the phase unbalance and the crosstalk between adjacent signal lines, the occurrence of electromagnetic interference (EMI) inside and outside the circuit board, etc.; consequently, these problems contribute to limitations on the maximum speed of the digital signal transmission.

Accordingly, in a signal transmission line using the differential line, the maximum transmission speed of the digital signal is limited to approximately 15 Gbps, and it is very difficult to transmit the digital signal at a speed equal to or higher than 15 Gbps. This serves as a limitation on the research and development of higher digital transmission speed.

In order to provide a solution for this, a technology that can apply a balanced line as a digital transmission line is required, where the balanced line possesses advantageous properties such as phase recovery, suppression of the electromagnetic interference (EMI), etc. For this purpose, a transition structure connecting the balanced line and the differential line can be designed by various methods, but the digital signal transmission performance utilizing the balance line is mostly determined by the performance of the designed transition structure.

For the optimal transition structure design, accurate characteristic impedance calculation is required to design for low loss and ultra-wideband characteristics, and the characteristic impedance of a cross-section of the transition structure can be calculated quickly through a cross-sectional structure analysis method. The cross-sectional structure analysis method is a design method that derives the characteristic impedance of the cross-sectional area of the structure by calculating the capacitance of each cross-sectional area using a conformal mapping method. In the analysis method, the cross-sectional area of the structure, which is perpendicular to the direction of signal transmission, is considered as a combination of several cross-sectional model types based on the electric field distributions. Thereby, the capacitance of the cross-section is obtained with the permittivity of the substrate using the conformal mapping method, consequently obtaining the characteristic line impedance.

That is, the optimal transition structure connecting the balanced line and the differential line is designed through the cross-sectional structure analysis method to achieve an ultra-high-speed digital transmission structure supporting digital data rate of approximately 100 Gbps.

DISCLOSURE

Technical Problem

An object of the present invention is to provide a transition structure for digital signal transmission that may transmit a digital signal at ultra-high-speed by connecting a balanced line to a differential line using an optimal transition structure in order to provide a solution for problems in the existing differential line. That is, a limitation of the transmission speed of the digital signals is determined by the performance of the transition structure described above.

Another object of the present invention is to provide a transition structure for digital signal transmission, which may also be applied to a general digital circuit substrate and a high-speed chip.

Yet another object of the present invention is to provide a digital transmission line structure in which the transition structure for digital signal transmission is placed on a dielectric substrate suitable for ultra-high-speed signal transmission to be connected to the general digital circuit board.

That is, the object of the present invention is to provide a balanced line-based digital transmission line capable of a higher-speed signal transmission than the existing digital transmission line by utilizing the transition structure.

Solution to Problem

In a general aspect, a transition structure for digital signal transmission, converting a differential line comprising two lines having opposite polarities into a balanced line while preserving a form of a differential signal, includes a dielectric substrate with a predetermined height; a first upper conductor and a second upper conductor disposed on top of the dielectric substrate and having opposite polarities; and a lower ground on the bottom of the dielectric substrate. A differential signal is transmitted through the transition structure while maintaining a phase difference between a positive signal line (e.g., the first upper conductor) and a negative signal line (e.g., the second upper conductor) in a vicinity of 180°.

Each of the first upper conductor and the second upper conductor may include: a fore-end strip; a rear-end strip having a width and a gap distance according to a line impedance; and a connecting strip connecting the fore-end strip and the rear-end strip. The width of the rear-end strip may be larger than that of the fore-end strip. The gap distance between the fore-end strips may remain the same as the gap distance between the rear-end strips.

The lower ground may include a first extender and a second extender. The first upper conductor and the second upper conductor may be positioned within an opening region between the first extender and the second extender along the direction of digital signal transmission.

The transition structure may include: a first region is a region where the fore-end strip of the first upper conductor, the fore-end strip of the second upper conductor, and the lower ground are positioned; a second region is a region where connecting strips that are extended from each of the fore-end strips and the first extender and the second extender of the lower ground are positioned; and a third region is a region where the rear-end strips that are extended from the connecting strips are positioned. The electric field distributions in the first to third regions may be different.

The characteristic impedance may be calculated from the electric field distributions in the first to third regions, along with the permittivity of the dielectric substrate. The width of the strips and gap distance between the upper conductors may be determined to achieve a characteristic impedance value corresponding to the impedance matching of the transition structure.

In another general aspect, a transition structure includes: a first lower conductor and a second lower conductor connected to the first upper conductor and the second upper conductor through the vias, respectively. The first lower conductor and the second lower conductor may be arranged to face the lower ground on which the first extender and the second extender are formed on the bottom of the dielectric substrate.

The widths of the first upper conductor and the second upper conductor may be larger than the widths of the first lower conductor and the second lower conductor. The gap distance between the first upper conductor and the second upper conductor is arranged to be the same as the gap distance between the first lower conductor and the second lower conductor.

The transition structure may further include: a first region is a region where the first upper conductor, the second upper conductor, and the lower ground are positioned; a second region is a region where the first upper conductor, the second upper conductor, and the first extender and the second extender of the lower ground are positioned; a third region is a region where the first lower conductor and the second lower conductor are positioned; and the vias are positioned on a boundary of the second region and the third region. The electric field distributions in the first to third regions may be different.

The characteristic impedance may be calculated from the electric field distributions in the first to third regions and the permittivity of the dielectric substrate, and the width of the strips and gap distance between the upper (or lower) conductors may be determined to have a characteristic impedance value corresponding to the impedance matching of the transition structure.

In another general aspect, a transition structure for digital signal transmission, converting a differential line comprising two lines having opposite polarities into a balanced line while preserving a form of a differential signal, includes: a dielectric substrate with a predetermined height; a first upper conductor and a second upper conductor disposed on top of the dielectric substrate and having opposite polarities and different strip lengths; a lower conductor connected to the second upper conductor on the bottom of the dielectric substrate and placed in parallel to the first upper conductor in a vertical direction; and a lower ground on the bottom of the dielectric substrate. A differential signal is transmitted through the structure while maintaining a phase difference between a positive signal line and a negative signal line in a vicinity of 180°.

The first upper conductor may have a variable width, and the second upper conductor may have a constant width.

The second upper conductor and the lower conductor may be connected through at least one via.

The transition structure may include: a first region is a region where the first upper conductor, the second upper conductor, and the lower ground are positioned; a second region is a region where the first upper conductor, the second upper conductor, and a first extender and a second extender of the lower ground are positioned; a third region is a region where the first upper conductor, the second upper conductor, an extender of the lower conductor, and a via (or vias) are positioned; and a fourth and fifth region on which the first upper conductor and the lower conductor are positioned. The electric field distributions in the first to fifth regions may be different.

The characteristic impedance may be calculated from the electric field distributions in the first to fifth regions, along with the permittivity of the dielectric substrate. The width of the strips and gap distance between the upper conductors may be determined to achieve a characteristic impedance value corresponding to the impedance matching of the transition structure.

In another general aspect, a transition structure for digital signal transmission, including a first dielectric substrate and a second dielectric substrate, and converting a differential line comprising two lines having opposite polarities into a balanced line while preserving a form of a differential signal, includes: a first upper conductor and a second upper conductor disposed on top of the first dielectric substrate and having opposite polarities; a first intermediate conductor and a second intermediate conductor disposed between the first and second dielectric substrate and connected to the first upper conductor and the second upper conductor, respectively, through vias; an intermediate ground disposed between the first and second dielectric substrate; and a lower conductor, which is placed on bottom of the second dielectric substrate, connected through at least one via to the second intermediate conductor on the bottom of the second dielectric substrate and disposed in parallel to the first intermediate conductor in a vertical direction. A differential signal is transmitted through the structure while maintaining a phase difference between a positive signal line and a negative signal line in a vicinity of 180°.

The first upper conductor and the second upper conductor may have constant widths and may be connected to the first intermediate conductor and the second intermediate conductor, respectively, through vias.

The first intermediate conductor may have a variable width, and the second intermediate conductor may have a constant width.

The second intermediate conductor and the lower conductor may be connected through at least one via.

The intermediate ground may include a first extender and a second extender. The first upper conductor and the second upper conductor may be positioned within an opening region between the first extender and the second extender along the direction of digital signal transmission.

The transition structure may further include: a first region is a region where the first upper conductor, the second upper conductor, and the intermediate ground are positioned; a second region is a region where the first upper conductor, the second upper conductor, and a first extender and a second extender of the intermediate ground are positioned; a third region is a region where the first upper conductor and the second upper conductor are positioned; a fourth region is a region where the first intermediate conductor and the second intermediate conductor are positioned; a fifth region is a region where the first intermediate conductor, the second intermediate conductor, an extender of the lower conductor, and at least one via connecting the second intermediate conductor and the extender are positioned; The sixth and seventh regions are regions where the first intermediate conductor and the lower conductor are positioned, and vias are formed on a boundary of the third and fourth regions. The electric field distributions in the first to seventh regions may be different.

The characteristic impedance may be calculated from the electric field distributions in the first to seventh regions, along with the permittivity of the dielectric substrate. The width of the strips and gap distance between the upper conductors or the intermediate conductors may be determined to achieve a characteristic impedance value corresponding to the impedance matching of the transition structure.

In another general aspect, a digital transmission line structure includes a first substrate with a differential line and a second substrate with lower loss than the first substrate. The second substrate is arranged with a balanced line with a transition structure connected to the differential line to transmit digital signals at a predetermined speed or higher while maintaining the form of a differential signal.

The transmission line structure according to the embodiment of this invention may include a plurality of dielectric substrate: a first conductor and a second conductor disposed on the first substrate and having opposite polarities; a third conductor and a fourth conductor of the second substrate connected to the first conductor and the second conductor of the first substrate through vias, respectively; a lower conductor connected to the fourth conductor through at least one via and disposed in parallel to the third conductor in a vertical direction; and a ground disposed on the first dielectric substrates. A differential signal is transmitted through the structure while maintaining a phase difference between a positive signal line and a negative signal line in a vicinity of 180°.

The second substrate is stacked on the first substrate. The differential line of the first substrate and the balanced line of the second substrate are connected through vias.

In another general aspect, a transmission line structure includes a plurality of dielectric substrates: a first conductor and a second conductor disposed on the first substrate and having opposite polarities; a third conductor and a fourth conductor of the second substrate connected to the first conductor and the second conductor of the first substrate through the connecting pads; a lower conductor that is connected to the fourth conductor through at least one via and disposed in parallel to the third conductor in a vertical direction; and a ground disposed on the first dielectric substrates. A differential signal is transmitted through the structure while maintaining a phase difference between a positive signal line and a negative signal line in a vicinity of 180°.

A mounting groove may be formed on the first substrate. When the second substrate is inserted and mounted into the mounting groove, the differential line of the first substrate and the balanced line of the second substrate may be connected through the connecting pads formed at the ends of the lines.

The digital signal may be transmitted at a speed of approximately 100 Gbps.

Effects of Invention

According to the present invention described above, the transition structure and the digital transmission line structure connecting the balanced line to the existing differential line for digital signal transmission can be provided to enhance the maximum digital signal transmission speed, limited due to the structural problem of the differential line in the related art, up to approximately 100 Gbps.

According to the present invention, the balanced line is connected to the differential line by using various-shaped optimal transition structures to transmit the digital signal at the ultra-high-speed while resolving problems in the existing differential line, such as interference between adjacent lines or the generation of a signal skew due to phase unbalance deviating from a 180° difference.

According to the present invention, an effect may be expected in which the transition structure for digital signal transmission may also be applied to general digital circuit boards and high-speed chips and thus easily applied to the $5^{th}$ and beyond $5^{th}$ generation communication technologies that should support high-performance and ultra-wideband frequency bandwidths.

DESCRIPTION OF DRAWINGS

FIGS. 17A and 17B are perspective views illustrating a transition structure for digital signal transmission according to a third embodiment of the present invention.

FIGS. 23A and 23B are perspective views illustrating a transition structure for digital signal transmission according to a fourth embodiment of the present invention.

BEST MODE FOR IMPLEMENTATION OF THE INVENTION

Figure 1:
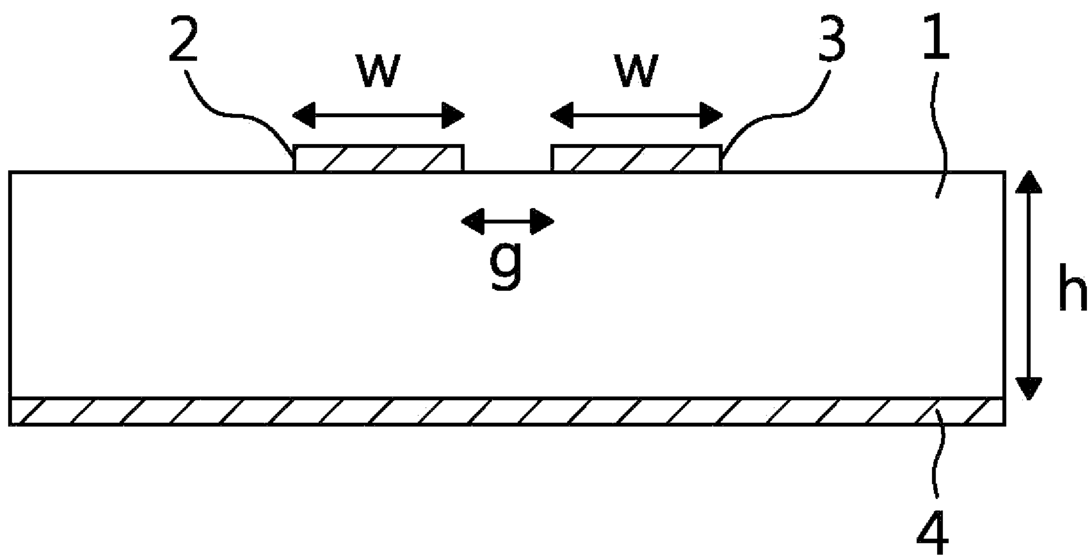
FIG. 1 illustrates a differential line structure.

The objects and effects of the present disclosure, and the technical configurations for achieving them, will become apparent upon reference to the embodiments described in detail with reference to the accompanying drawings. In describing the invention, detailed descriptions of known features or configurations will be omitted where it is deemed that such descriptions would unnecessarily obscure the essence of the invention.

The following terms are defined in view of their function in the present invention, which may vary depending on the user, operator's intent or convention.

However, the invention is not limited to the embodiments disclosed herein and may be implemented in many different forms. The embodiments are provided only to make the disclosure of the invention complete and to give a complete picture of the scope of the invention to one of ordinary skill in the art to which the invention belongs, and the invention is defined by the scope of the claims. The invention is therefore to be defined by the scope of the claims.

The present invention proposes an ultra-high-speed digital transmission line connecting a differential line and a balanced line using an optimized transition structure in order to solve a problem in the existing digital transmission line configured by the differential line. Here, the balanced line, including the transition structure, has a frequency bandwidth of dozens of GHz or more, principally allows to propagate only a differential signal, and enables electromagnetic interference (EMI) suppression, phase recovery, etc. Further, the balanced line may be configured to have various line impedances according to the situation of the circuit. On the contrary, most of the existing differential lines use a line impedance of 100Ω.

According to the present invention, a digital transmission line with the transition structure is provided to transmit a digital signal with a speed of approximately 100 Gbps, which is much higher than the maximum transmission speed of approximately 15 Gbps with the differential lines. In addition, the transition structure of the present invention may also be applied to a general digital circuit board and a high-speed chip, of course.

In the following, the invention will be described in more detail with reference to the embodiments shown in the drawings.

First, a differential line and a balanced line will be described.

FIG. 1 illustrates a differential line structure. Referring to FIG. 1, a dielectric substrate 1 having a height h is provided, and a first conductor 2 and a second conductor 3, which may have signals with opposite polarities to each other, are placed on top of the dielectric substrate 1, and a ground 4 is formed on the bottom of the dielectric substrate 1. The first conductor 2 and the second conductor 3 have opposite polarities to each other. In the embodiment, the first conductor 2 may be a positive signal line and the second conductor 3 may be a negative signal line. The widths w of the first conductor 2 and the second conductor 3 are equal to each other, and the first conductor 2 and the second conductor 3 are spaced apart from each other by a gap distance g.

Figure 2:
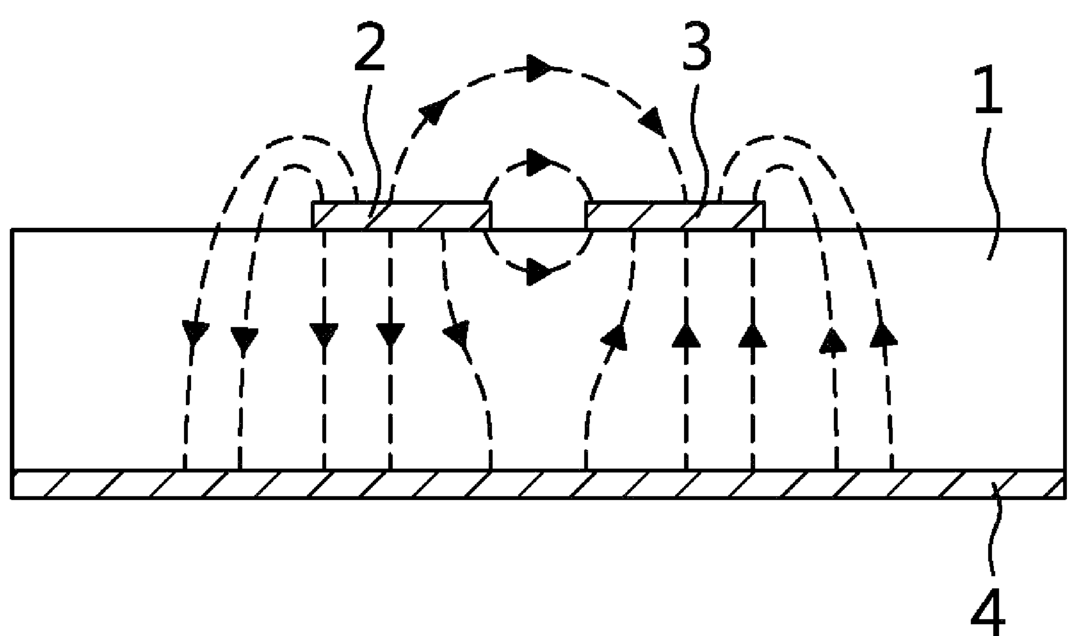
FIG. 2 is a diagram illustrating an electric field distribution of the differential line in FIG. 1.

FIG. 2 is a diagram illustrating an electric field distribution of the differential line in FIG. 1. Referring to FIG. 2, in case of an ideal differential line, signals having opposite polarities are propagated to the first conductor 2 and the second conductor 3 on top of the dielectric substrate 1. Therefore, electric field lines are present, which connect the first conductor 2 and the second conductor 3. In addition, electric field lines that head to ground 4 on the bottom of the dielectric substrate 1 from the positive signal line and electric field lines that head to the negative signal line, which is the second conductor 3, from the ground 4 on the bottom of the dielectric substrate 1, are distributed. Some of the electric field lines may connect the first conductor 2 and the second conductor 3, as shown in FIG. 2. The electric field lines in FIG. 2 are independent.

With respect to the ideal differential line, that is, when line lengths of the first conductor 2 and the second conductor 3 are completely equal to each other during propagation from generation of the differential signal, the amplitudes of two line signals are the same as each other, and the polarities of phases of two line signals are opposite to each other (180° phase difference) in a receiver. However, actually, in most cases, a length difference between two signal lines of the differential line occurs by line placement in the dielectric substrate 1 (for example, when the line is curved). As such, when a difference in line length occurs, a phase unbalance is generated, which causes degradated integrity of digital signal transmission. For such a reason, there is a limitation on the maximum transmission speed, as mentioned above.

In the present invention, the balanced line is connected to the differential line to achieve a faster speed of digital signal transmission. The balanced line has advantageous properties such as providing ultra-wideband signal transmission, suppressing electromagnetic interferences, autonomously recovering phase differences in the presence of a phase difference, which deviates from 180°, between the two signal lines, and controlling interferences between the adjacent lines. In addition, the design parameters of the balanced line can easily be calculated through the analytic formulas for various substrate dielectric constants, and a design for enhanced performance is possible by changing the proper characteristic line impedance. A parallel strip line (PSL), which is one of the types of balanced lines, maintains signal integrity even in a curved line.

Such a balanced line may be divided into a first-type balanced line (coplanar strip line (CPS)) and a second-type balanced line (parallel strip line (PSL)).

Figure 3:
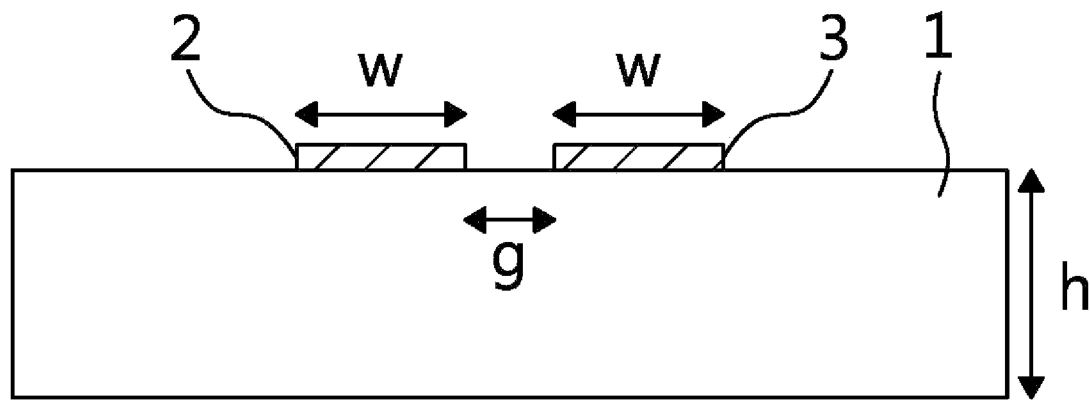
FIG. 3 illustrates a first-type balanced line structure.

FIG. 3 illustrates a first-type balanced line structure. When the first-type balanced line is compared with the differential line, there is no ground, and in general, the widths and a gap distance of the first-type balanced lines are different from those of the differential line.

A dielectric substrate 1 having a predetermined height h is placed, and the first conductor 2 and the second conductor 3 having opposite polarities are placed on top of the dielectric substrate 1. The widths w of the first conductor 2 and the second conductor 3 are equal to each other, and the first conductor 2 and the second conductor 3 are spaced apart from each other by a gap distance of g. Electric field distributions of the first conductor 2 and the second conductor 3 are strongly dependent on each other. In the embodiment, the first conductor 2 may be the positive signal line, and the second conductor 3 may be the negative signal line.

Figure 4A:
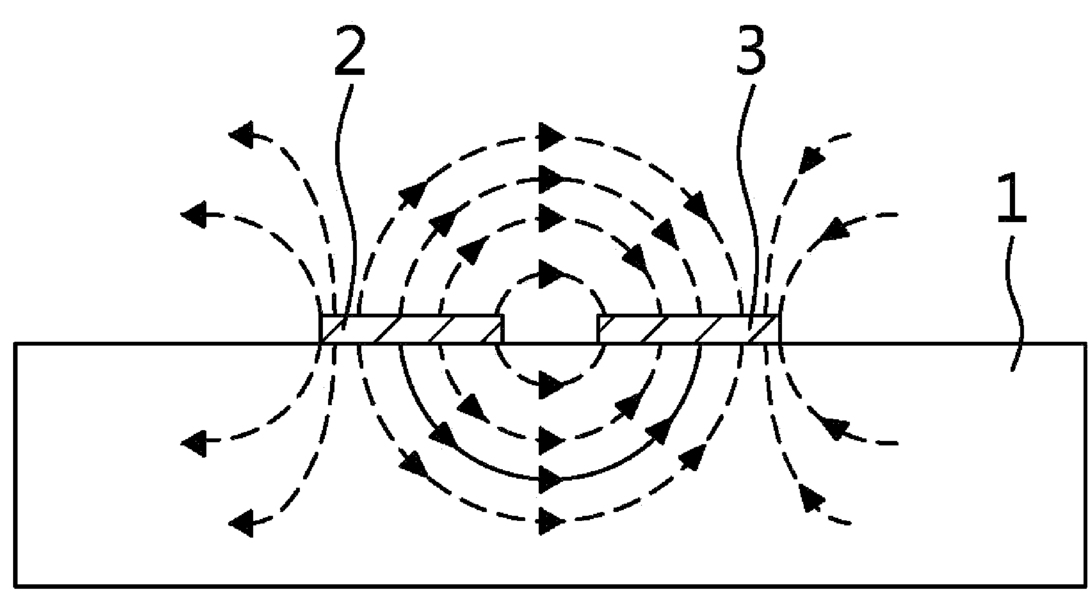
FIGS. 4A and 4B are diagrams illustrating electric field distributions of the first-type balanced line.
Figure 4B:
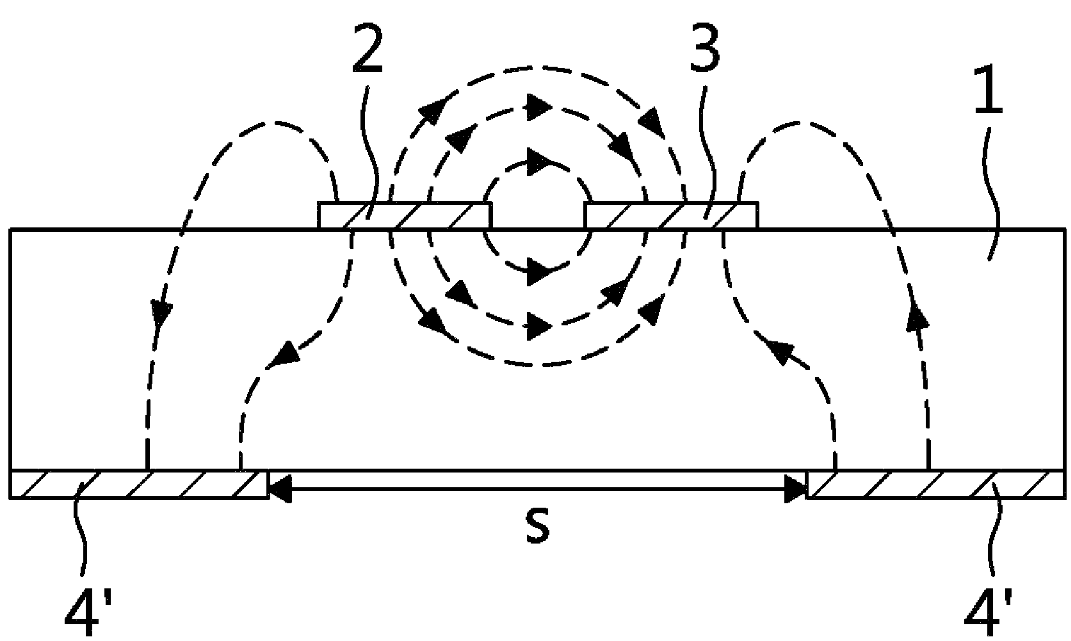

FIGS. 4A and 4B are diagrams illustrating electric field distributions of the first-type balanced line.

FIG. 4A illustrates an electric field distribution of an ideal first-type balanced line, and there are only electric field lines that head to the negative signal line, which is the second conductor 3, from the positive signal line, which is the first conductor 2.

That is, this structure supports a condition in which the electric field lines are continuously formed between the first conductor 2 and the second conductor 3.

However, actually, as illustrated in FIG. 4B, a ground 4' may be present on the bottom of the dielectric substrate 1, and there exist the electric field lines between the top conductors and the ground 4'. In this case, the characteristics of the balanced line may not be provided when a gap distance between the ground 4' is small. Therefore, it is necessary to optimally maintain an opening width s on the ground 4'. That is, a desired electric field distribution is made while changing the length of the ground 4' so as to optimally provide the opening width s on the ground 4'. Typically, when the opening width s on the ground 4' satisfies '$s>3(2w+g)$', the corresponding first-type balanced line is regarded as the ideal first-type balanced line.

Figure 5:
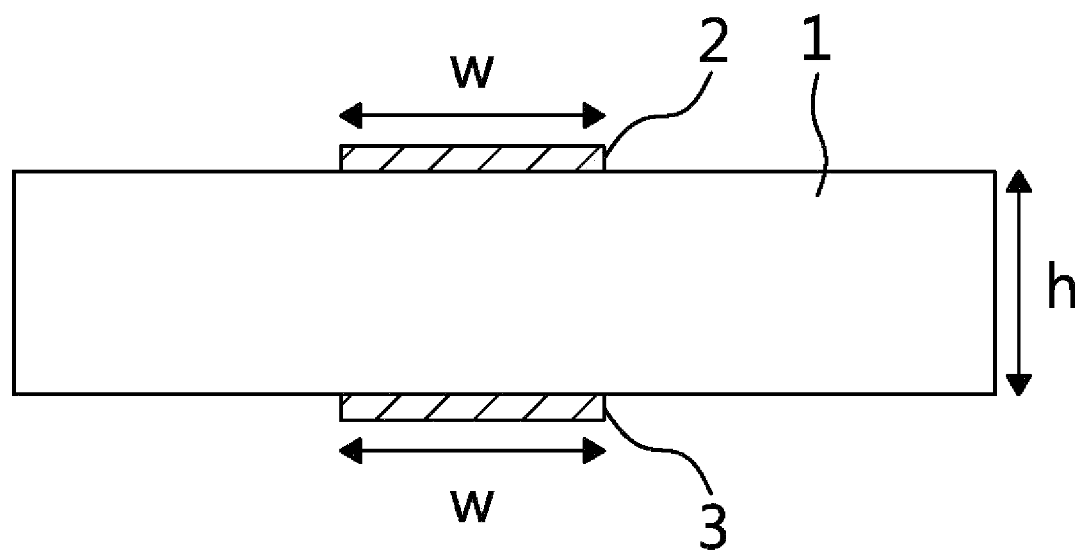
FIG. 5 illustrates a second-type balanced line structure.

FIG. 5 illustrates a second-type balanced line structure. As illustrated in FIG. 5, a dielectric substrate 1 having the predetermined height h and the first conductor 2 on top of the dielectric substrate 1 are placed, and the second conductor 3 is placed on the bottom of the dielectric substrate 1. The first conductor 2 and the second conductor 3 have opposite polarities to each other and are placed in parallel to each other. The widths w of the first conductor 2 and the second conductor 3 are equal to each other. In the embodiment, the first conductor 2 may be the positive signal line, and the second conductor 3 may be the negative signal line.

Figure 6A:
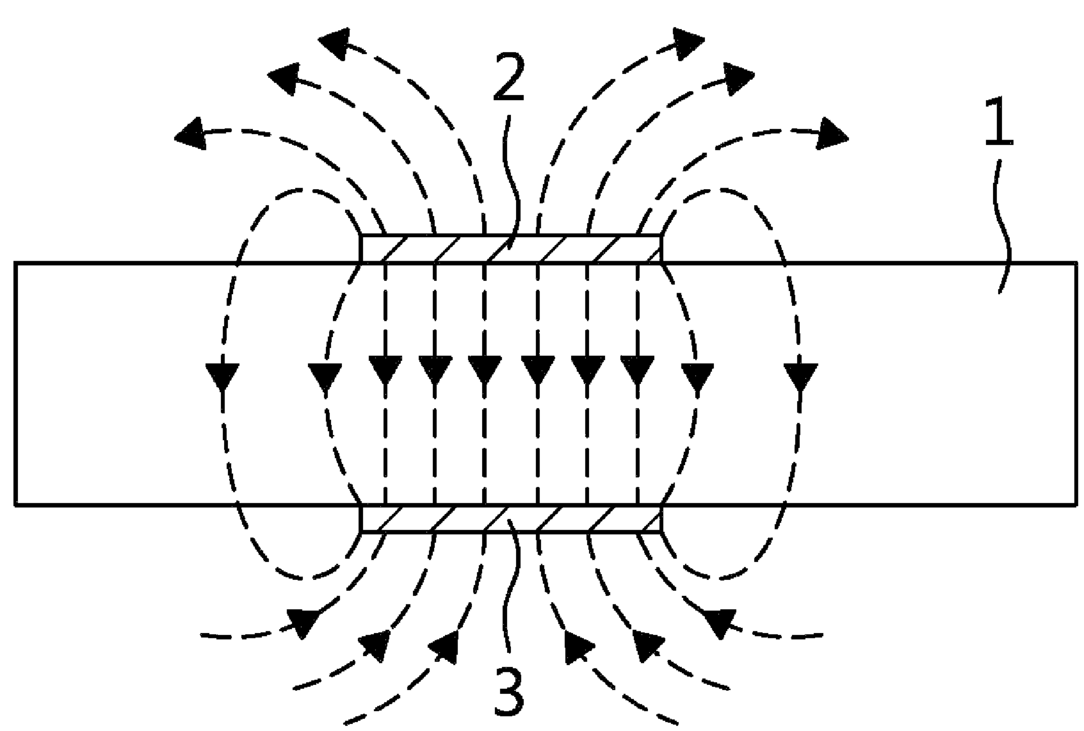
FIGS. 6A and 6B are diagrams illustrating electric field distributions of the second-type balanced line.
Figure 6B:
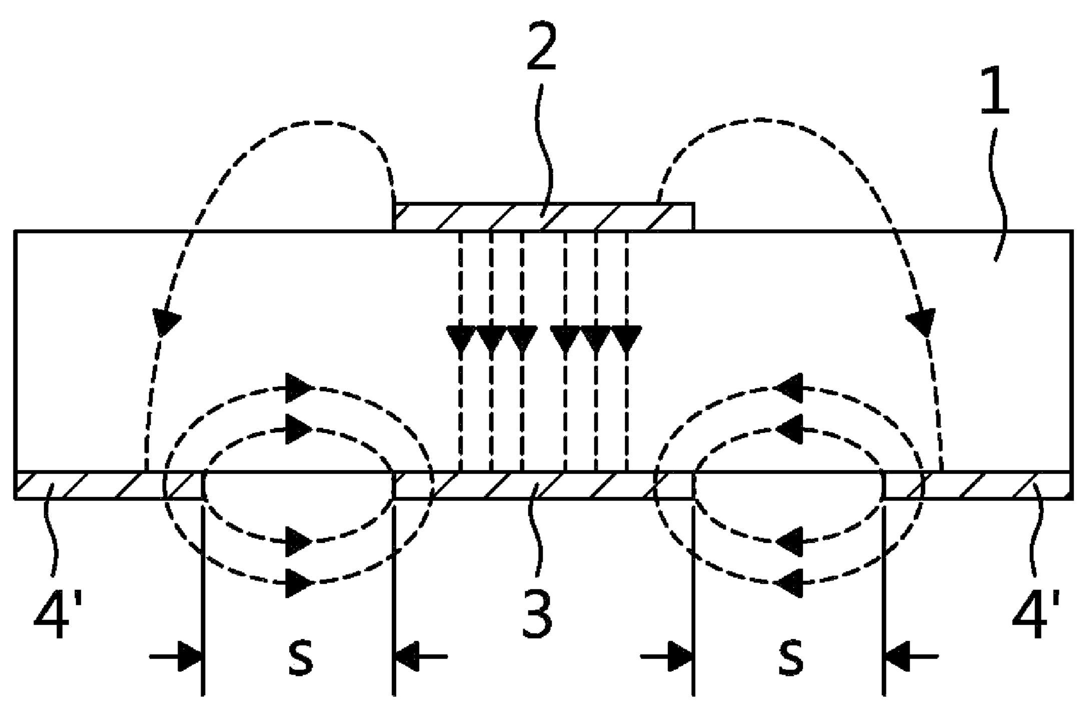

FIGS. 6A and 6B are diagrams illustrating electric field distributions of the second-type balanced line.

FIG. 6A illustrates an electric field distribution of an ideal second-type balanced line, and there are only electric field lines that head to the negative signal line, which is the second conductor 3, from the positive signal line, which is the first conductor 2. However, actually, as illustrated in FIG. 6B, there may be the ground 4' at left and right sides around the second conductor 3 on the bottom of the dielectric substrate 1, and therefore, unlike FIG. 6A, electric field lines connecting the first conductor 2 or the second conductor 3 to the ground 4' may be distributed. The second conductor 3 and the ground 4' are spaced apart from each other by a predetermined opening width s. Even in the second-type balanced line, a desired electric field distribution may be made while changing the length of the ground 4' so as to optimally provide the opening width s. Typically, when an opening width s between the second conductor 3 and the ground 4' satisfies '$s>w$', the corresponding second-type balanced line is regarded as the ideal second-type balanced line.

Next, a configuration for connecting the balanced line to the existing differential line by using the transition structure proposed by the present invention is described. Hereinafter, with respect to the digital signal transmission direction of the embodiment, the differential line will be set as the transmitting side and the balanced line will be set as the receiving side. However, in the embodiment of the present invention, the balanced line is connected to a transmitter, and the differential line is connected to the receiver to transmit the digital signal in reverse order through the transition structure.

Figure 7A:
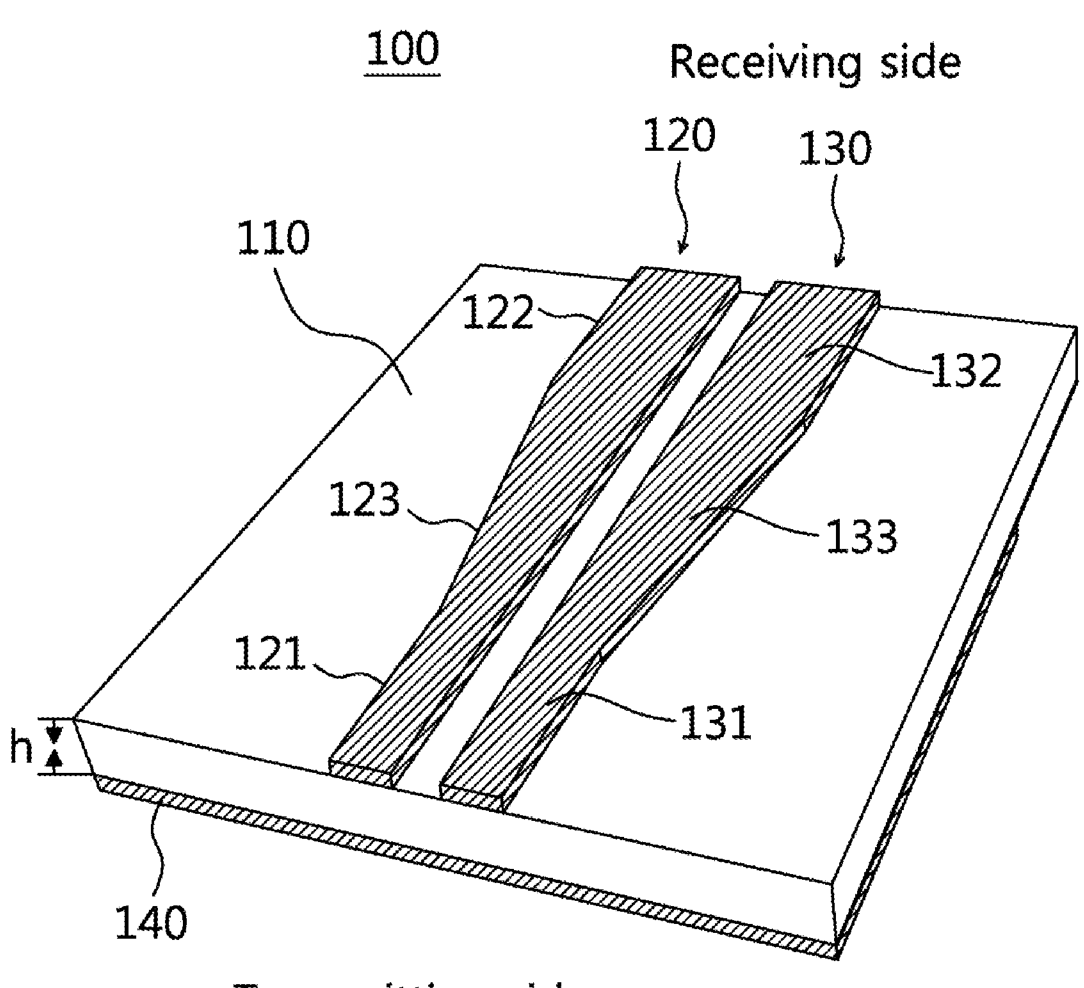
FIGS. 7A and 7B are perspective views illustrating a transition structure for digital signal transmission according to a first embodiment of the present invention.
Figure 7B:
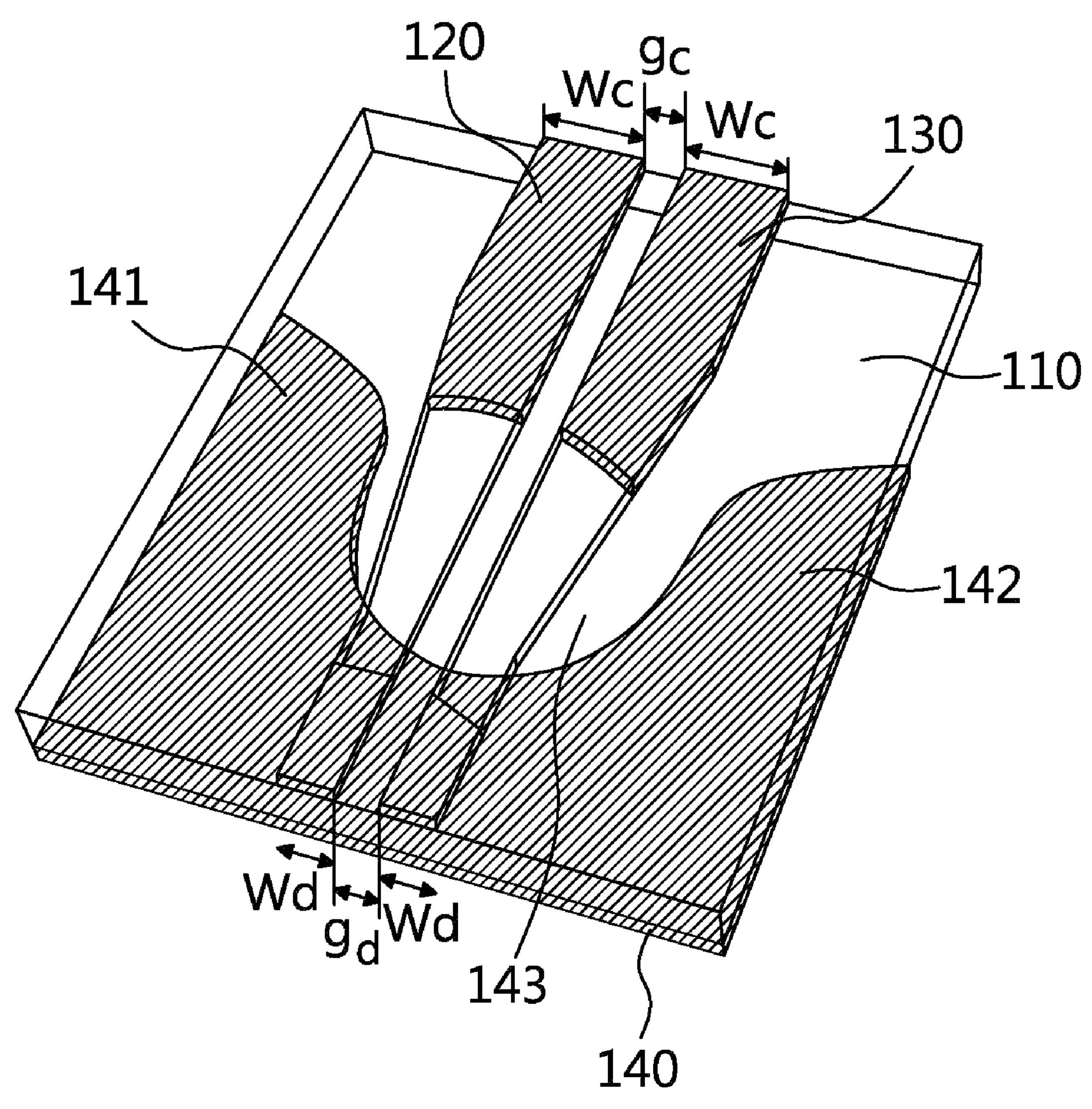

FIGS. 7A and 7B are perspective views illustrating a transition structure for digital signal transmission according to the first embodiment of the present invention.

As illustrated in FIGS. 7A and 7B, the transition structure 100 for digital signal transmission according to the first embodiment includes a substrate 110, a first upper conductor 120 and a second upper conductor 130 placed on top of the substrate 110, and a lower ground 140 placed on the bottom of the substrate 110.

As the embodiment, the first upper conductor 120 may be the positive signal line, and the second upper conductor 130 may be the negative signal line. That is, the first upper conductor 120 and the second upper conductor 130 may have opposite polarities to each other. In addition, the substrate 110 adopts a dielectric substrate having a smaller dielectric loss than a general FR4 substrate and will be hereinafter referred to as the dielectric substrate 110. However, in the embodiment of the present invention, an FR4 based substrate may be used. The reason is that even though the FR4 substrate is used, the transmission speed of the digital signal may be improved, and the phase unbalance generated by the length difference of the differential line may be recovered.

As the embodiment, widths Wd and a gap distance gd of a 1-1st strip 121 and a 2-1st strip 131 of the transmitting side (differential line) are selected to be smaller than widths Wc and equal to a gap distance gc of a 1-2nd strip 122 and a 2-2nd strip 132 of the receiving side (balanced line), respectively, but may vary depending on a choice of the impedance of the receiving side (balanced line), the type of dielectric substrate 110, and the configuration whether a dielectric body is present on an upper surface or a lower surface of the dielectric substrate 110.

The first upper conductor 120 and the second upper conductor 130 are placed to be symmetric to each other while being spaced apart from each other by predetermined gap distances gd and gc. The gap distances gd and gc are the same as each other. In addition, the first upper conductor 120 is configured to include the 1-1st strip 121 (fore-end strip) and the 1-2nd strip 122 (rear-end strip), and a first connector 123 (connection strip) connecting the 1-1st strip 121 and the 1-2nd strip 122. The second upper conductor 130 is configured to include the 2-1st strip 131 (fore-end strip) and the 2-2nd strip 132 (rear-end strip), and a second connector 133 (connection strip) connecting the 2-1 st strip 131 and the 2-2nd strip 132.

The 1-1st strip 121 and the 2-1st strip 131, and the 1-2nd strip 122 and the 2-2nd strip 132 have different widths. The widths of the first connectors 123 and 133 are formed to increase, so the widths Wc of the 1-2nd strip 122 and the 2-2nd strip 132 are larger than the widths Wd of the 1-1 st strip 121 and the 2-1st strip 131. That is, the conductor width of the receiving side is formed to be larger than that of the transmitting side of the digital signal.

The lower ground 140 overlaps partial regions of the first upper conductor 120 and the second upper conductor 130, and the first and second extenders 141 and 142 are formed on one conductor plate at the left and right sides of the lower ground 140. The first and second extenders 141 and 142 are formed in a shape extending toward the receiving-side direction, and therefore, the first and second regions 141 and 142 are formed in a shape in which a central region is concave. A spacing gap area between the first and second extenders 141 and 142 will be referred to as an opening region 143. The first upper conductor 120 and the second upper conductor 130 are positioned in the opening region 143 in the propagation direction of the digital signal.

Figure 8:
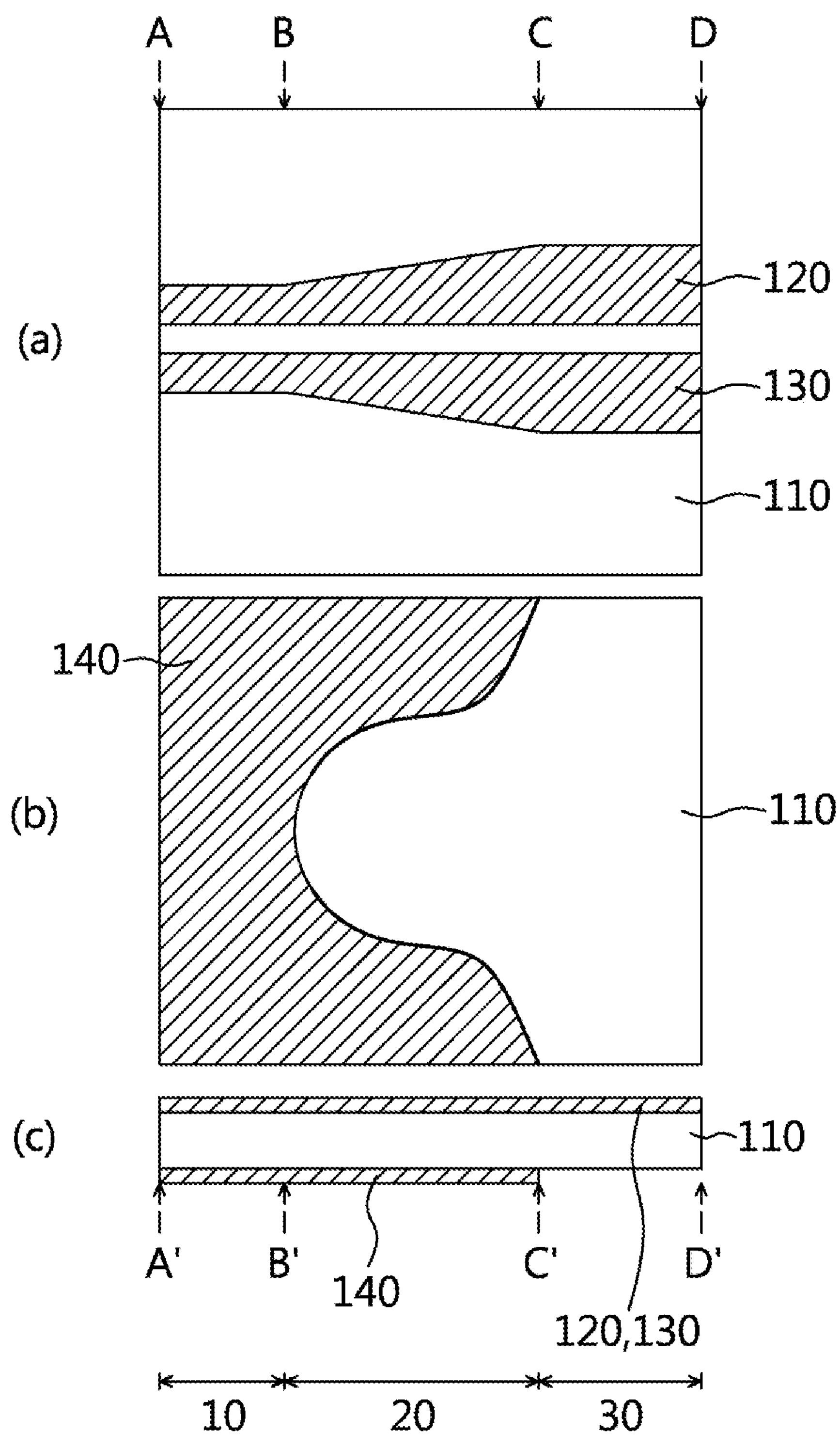
FIG. 8 illustrates the respective locations of the first upper conductor, the second upper conductor, and the lower ground based on the dielectric substrate to be compared.

FIG. 8 illustrates plan views and a cross-sectional view illustrating the first upper conductor and the second upper conductor, and the lower ground based on the dielectric substrate to clarify their respective locations.

When (a) of FIG. 8, (b) of FIG. 8, and (c) of FIG. 8 are compared, the first upper conductor 120 and the second upper conductor 130 elongate in a longitudinal direction from one end (i.e., transmitting side) to the other end (i.e., receiving side) of the dielectric substrate 110 and are designed with the widths gradually increased. In addition, the lower ground 140 is designed so that the first and second extenders 141 and 142 are formed, and the opening region 143, having a concave shape, is formed between the first and second extenders 141 and 142. The first upper conductor 120 and the second upper conductor 130 are positioned in the opening region 143 in the propagation direction of the digital signal.

Referring to FIGS. 7 and 8, the transition structure 100 may be divided into a first region 10, a second region 20, and a third region 30. The first region 10 is a region where the 1-1st strip 121 and the 2-1st strip 131 and the lower ground 140 are positioned; the second region 20 is a region where the first connector 123 and the second connector 133, and the first and second extenders 141 and 142 of the lower ground 140 are positioned; and the third region 30 is a region where the 1-2nd strip 122 and the 2-2nd strip 132 are positioned.

Figure 9:
FIG. 9's (a) to (c) illustrate electric field distributions of the first to third regions formed in the transition structure 100 according to the first embodiment.
Figure 9:
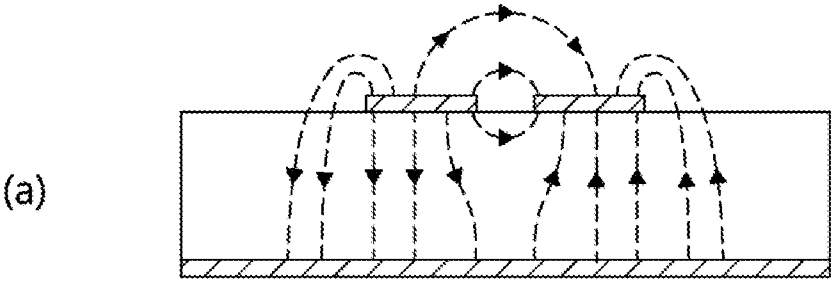
Figure 9:
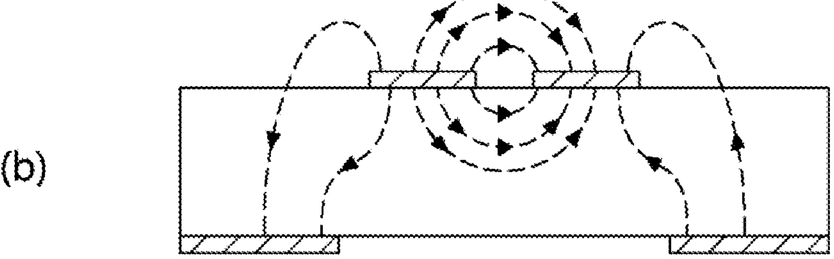
Figure 9:
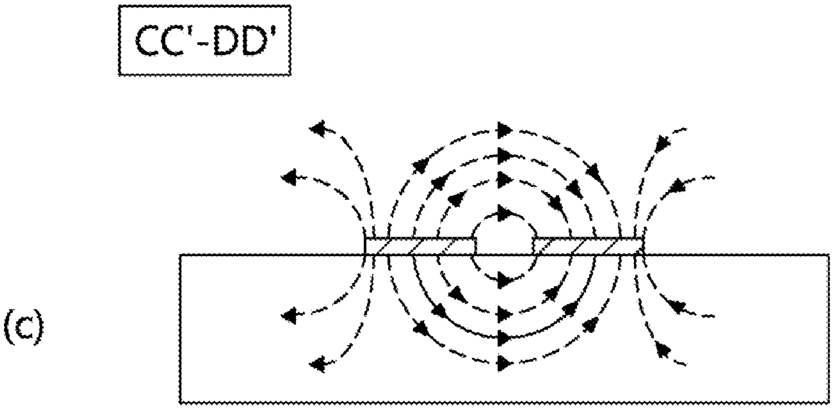

FIG. 9's (a) to (c) illustrate electric field distributions of first to third regions 10, 20, and 30 formed in the transition structure 100 according to the first embodiment.

(a) of FIG. 9 illustrates the electric field distribution of the first region 10. Referring to (a) of FIG. 9, it can be seen that there are electric field lines that head to the lower ground 140 from the first upper conductor 120, electric field lines that head to the second upper conductor 130 from the lower ground 140, and electric field lines that connect the first upper conductor 120 and the second conductor 130. The electric field distribution is the same as the electric field distribution of the differential line in FIG. 2, as described above.

(b) of FIG. 9 illustrates the electric field distribution of the second region 20. Referring to (b) of FIG. 9, it can be seen that there are electric field lines that head to the first extender 141 from the first upper conductor 120 due to the opening region 143, electric field lines that head to the second upper conductor 130 from the second extender 142, and electric field lines that connect the first upper conductor 120 and the second conductor 130. The electric field distribution is the same as the electric field distribution of the first-type balanced line in FIG. 4B, as described above. In this case, an opening width s between the first and second extenders 141 and 142 may preferably be selected to form an optimal impedance taper to minimize signal loss.

(c) of FIG. 9 illustrates the electric field distribution of the third region 30. Referring to (c) of FIG. 9, in the third region 30, only electric field lines that head to the second upper conductor 130 from the first upper conductor 120 are present because there is no lower ground. That is, the electric field lines are concentrated between the first upper conductor 120 and the second upper conductor 130. The electric field distribution is the same as the electric field distribution of the first-type balanced line in FIG. 4A, as described above.

Figure 10:
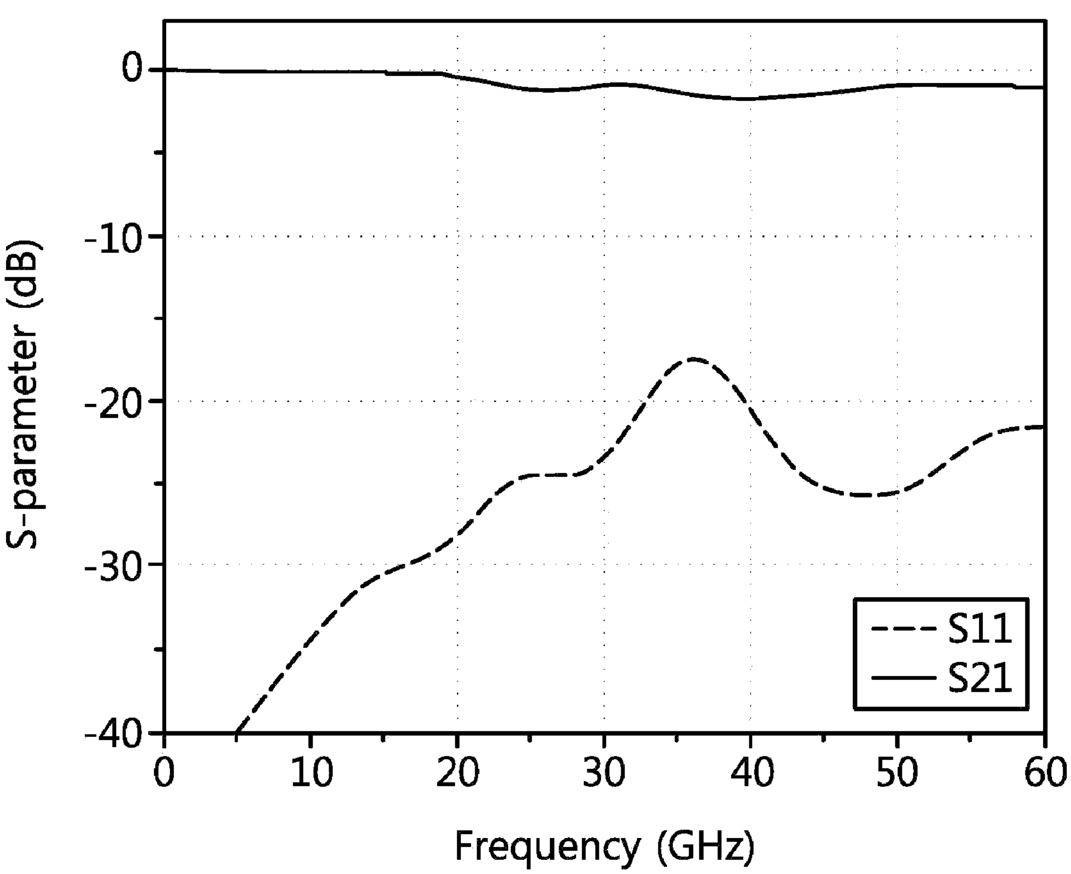
FIG. 10 is a frequency domain graph showing reflection loss S11 and insertion loss S21 of the transmission line when the transition structure of the first embodiment is applied.

FIG. 10 is a frequency domain graph showing reflection loss S11 and insertion loss S21 of the transmission line when the transition structure of the first embodiment is applied. Referring to FIG. 10, it can be seen that the frequency bandwidth is widely distributed up to 60 GHz, thereby the characteristics of the ultra-wideband may be confirmed.

Figure 11:
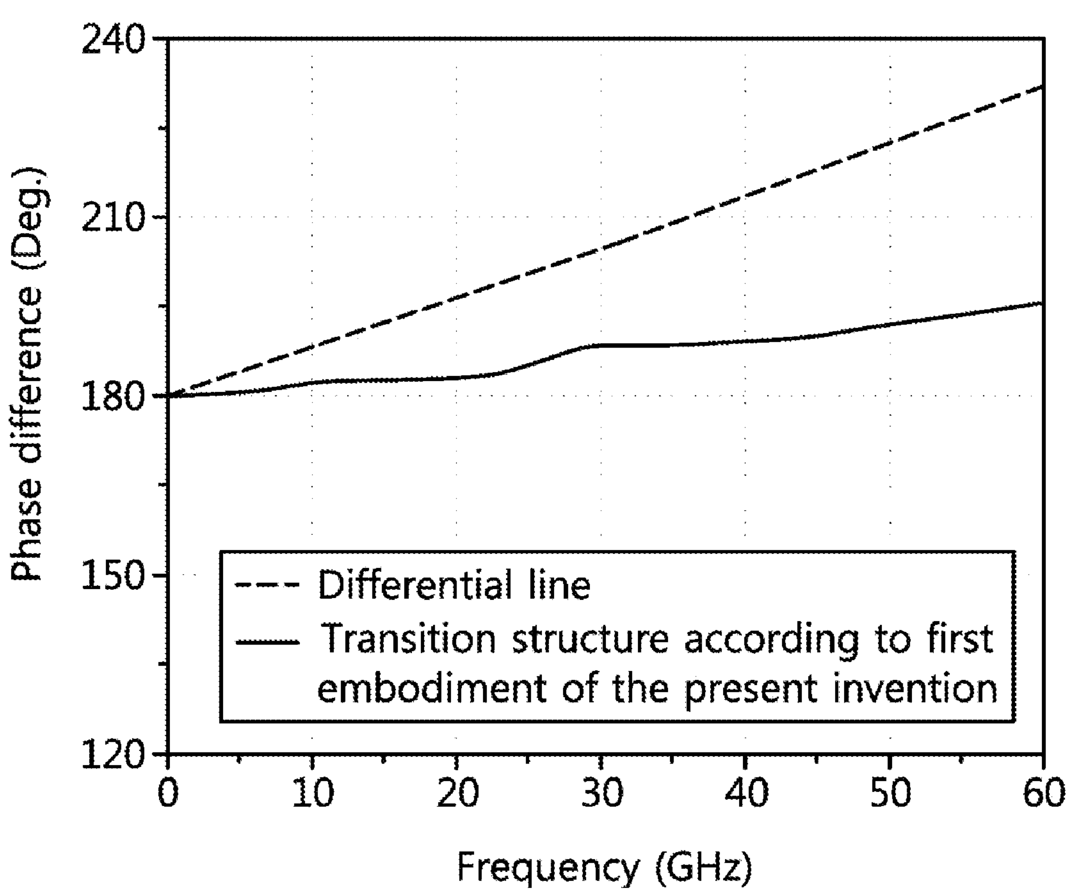
FIG. 11 is a frequency domain graph showing a phase difference when the differential line, where the line lengths of the positive signal line and the negative signal line are different, is connected to the transition structure of the first embodiment.

FIG. 11 is a frequency domain graph showing a phase difference when the differential line, where the line lengths of the positive signal line and the negative signal line are different, is connected to the transition structure of the first embodiment. The embodiment is a frequency domain graph when a transmission line, which is implemented on the substrate with a relative permittivity of 2.2 and a height h of 0.254 mm, is provided, and there is a length difference of 0.508 mm between the positive signal line and the negative signal line. Referring to FIG. 11, with conventional differential lines, the occurrence of length differences between the two signal lines due to various causes are unavoidable, and in this case, the phase unbalance, which may cause various problems, is generated and limits the maximum operation frequency.

On the contrary, it can be seen that, from the result of the first-type transition structure of the present invention, the phase difference between the positive signal line and the negative signal line is maintained around 180° due to the autonomous phase recovery characteristics of the balanced line.

Mode for Implementation of the Invention

Figure 12A:
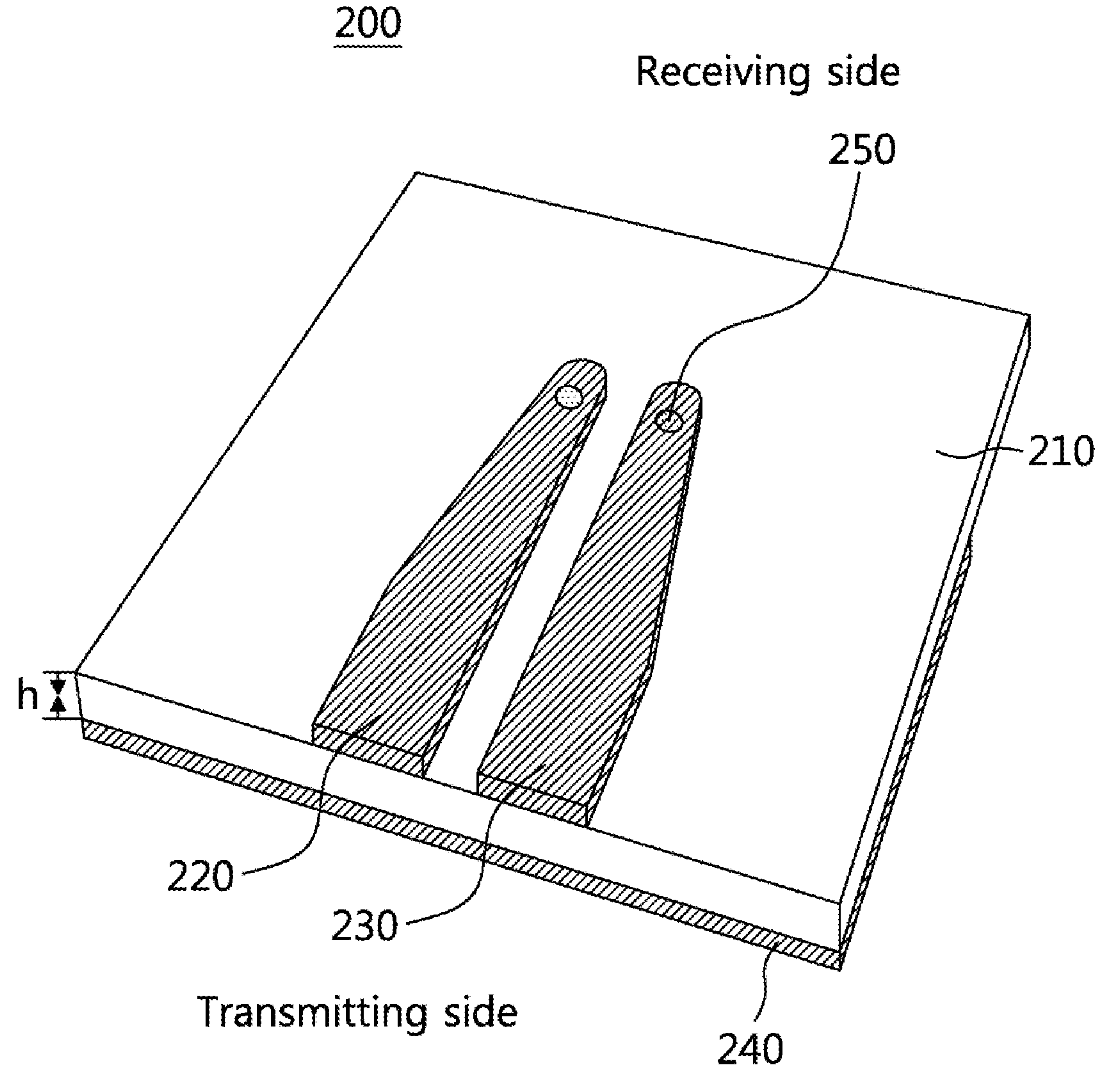
FIGS. 12A and 12B are perspective views illustrating a transition structure for digital signal transmission according to a second embodiment of the present invention.
Figure 12B:
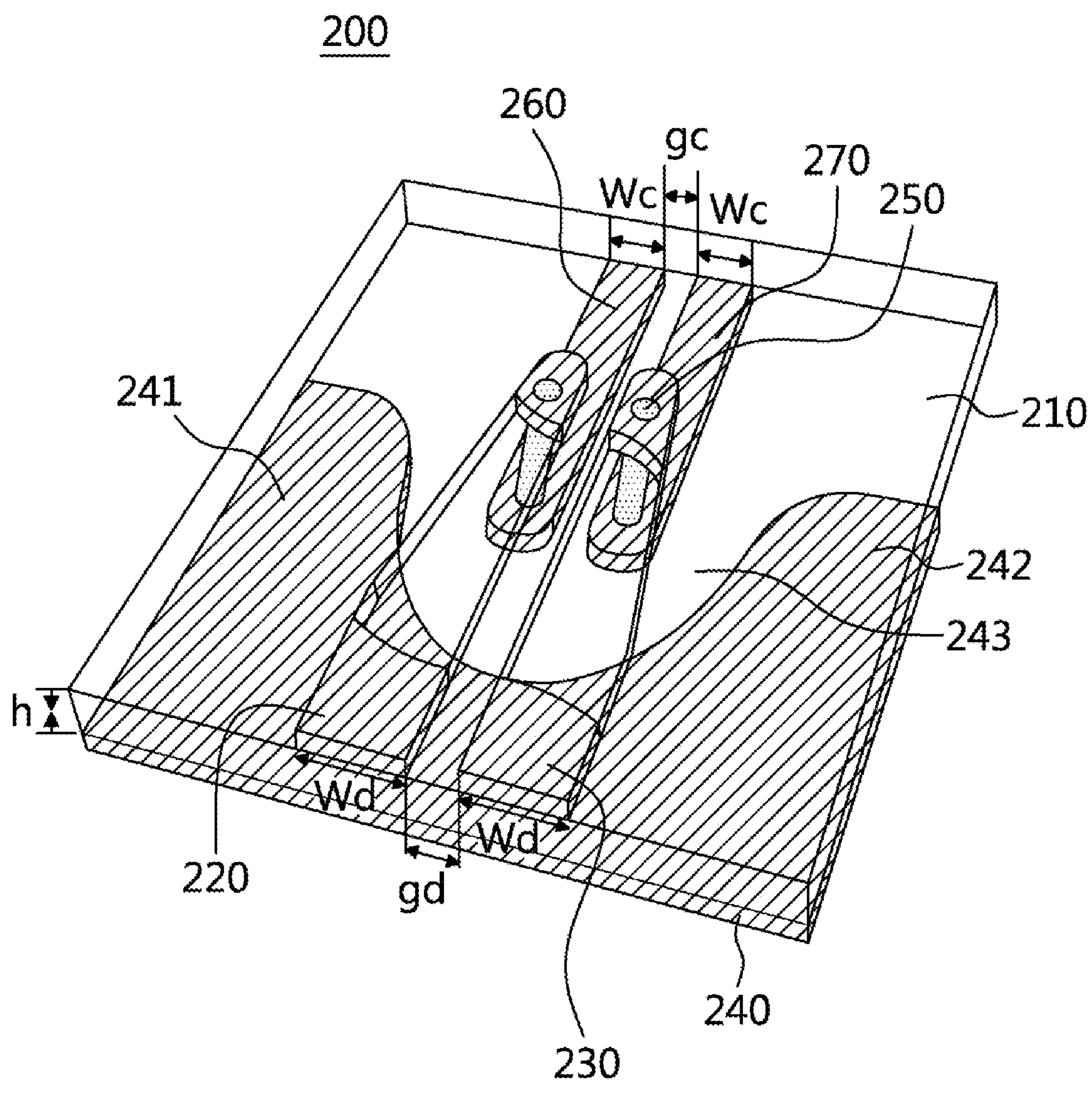

FIGS. 12A and 12B are perspective views illustrating a transition structure for digital signal transmission according to a second embodiment of the present invention.

As illustrated in FIGS. 12A and 12B, the transition structure 200 for digital signal transmission according to the second embodiment includes a substrate 210, a first upper conductor 220 and a second upper conductor 230 placed on top of the substrate 210, a first lower conductor 260 and a second lower conductor 270 placed on the bottom of the substrate 210, vias 250 connecting the upper conductors 220 and 230 and the lower conductors 260 and 270, respectively, and a lower ground 240 placed on the bottom of the substrate 210.

The substrate 210 adopts a dielectric substrate with a small dielectric loss. Of course, as in the first embodiment of the present invention, the FR4 based substrate may be used.

The first upper conductor 220 and the second upper conductor 230, and the first lower conductor 260 and the second lower conductor 270 have opposite polarities, respectively. In the embodiment, the first upper conductor 220 and the first lower conductor 260 may be the positive signal lines, and the second upper conductor 230 and the second lower conductor 270 may be the negative signal lines.

As shown in the embodiment, the widths Wd of the first upper conductor 220 and the second upper conductor 230 of the transmitting side (differential line) are selected to be larger than the widths Wc of the first lower conductor 260 and the second lower conductor 270 of the receiving side (balanced line). Also, the gap distance gd of the first upper conductor 220 and the second upper conductor 230 of the transmitting side is selected to be equal to the gap distance gc of the first lower conductor 260 and the second lower conductor 270 of the receiving side. However, the widths (Wd and Wc), and the gaps (gd and gc) may vary depending on a choice of the impedance of the receiving side (balanced line), the type of substrate 210, and whether the dielectric body is present on an upper surface or a lower surface of the substrate 210.

The first upper conductor 220 and the second upper conductor 230 are spaced apart from each other by a first gap distance gd, have a predetermined length toward the inside from one end of the substrate 210, and are formed with the widths Wd gradually decreasing in the propagation direction of the digital signal. The first lower conductor 260 and the second lower conductor 270 are spaced apart from each other by a second gap distance gc have a predetermined length toward the inside from the other end of the substrate 210, and are formed with the widths Wc, which are constant.

The widths Wd of the first upper conductor 220 and the second upper conductor 230 are larger than the widths Wc of the first lower conductor 260 and the second lower conductor 270, and the first gap distance gd and the second gap distance gc are the same as each other. The first upper conductor 220 and the first lower conductor 260, and the second upper conductor 230 and the second lower conductor 270 are connected, respectively, through the vias 250 formed in the substrate 210.

The lower ground 240 is placed to overlap partial regions of the first upper conductor 220 and the second upper conductor 230, and the first and second extenders 241 and 242 are formed on one conductor plate at the left and right sides of the lower ground 240. The first and second extenders 241 and 242 are formed in a shape extending toward the receiving-side direction, and therefore, a central region is formed in a concave shape. The first upper conductor 220 and the second upper conductor 230 are positioned in an opening region 243 between the first and second extenders 241 and 242 in the propagation direction of the digital signal.

In FIGS. 12A and 12B, only a two-layer structure in which the upper conductors 220 and 230 and the lower conductors 260 and 270 are connected, respectively, through the via 250 is described, but when additional dielectric substrates are provided and the vias connect the corresponding structures on each dielectric substrate layer, a transition structure of three layers or more, may also be manufactured.

The present invention also includes designing the transition structure of three layers or more as described above. Such a structure may also be applied to the structure of another embodiment described below.

Figure 13:
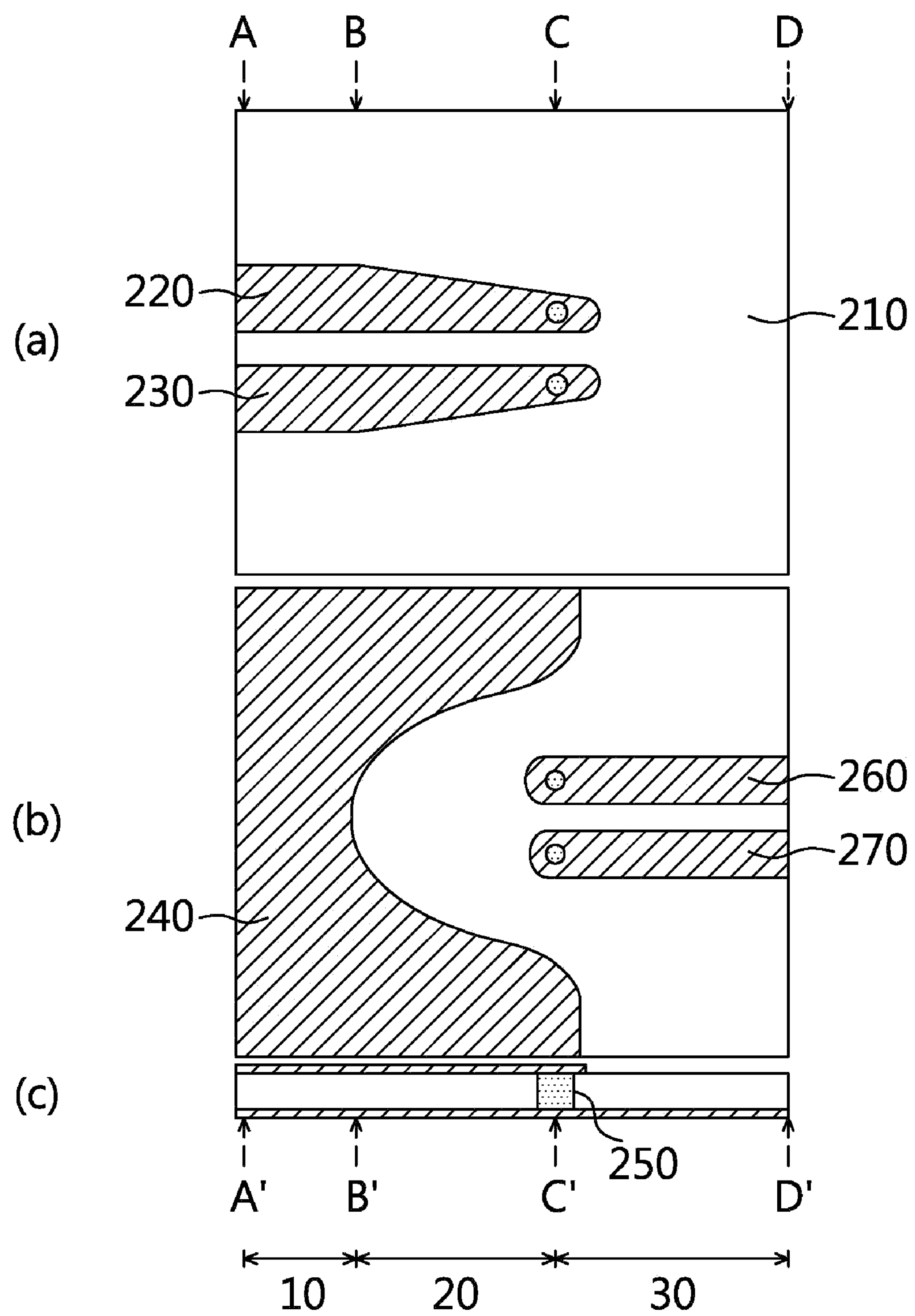
FIG. 13 is a diagram illustrating the respective locations of upper conductors and lower conductors, and a via and a lower ground connecting the upper conductors and the lower conductors, respectively, based on the dielectric substrate to be compared.

FIG. 13 is a diagram illustrating the respective locations of upper conductors, lower conductors, vias connecting the upper conductors and the lower conductors, and a lower ground, respectively, based on the dielectric substrate.

As illustrated in FIG. 13, the transition structure 200 of the second embodiment may be divided into a first region 10, a second region 20, and a third region 30. The first region 10 is a region where the first upper conductor 220, the second upper conductor 230, and the lower ground 240 are all positioned. The second region 20 is a region where the first upper conductor 220, the second upper conductor 230, and the first and second extenders 241 and 242 of the lower ground 240 are positioned. The third region 30 is a region where only the first lower conductor 260 and the second lower conductor 270 are positioned. In FIG. 13, it is illustrated that the vias 250 are formed on the boundary of the second region 20 and the third region 30.

Figure 14:
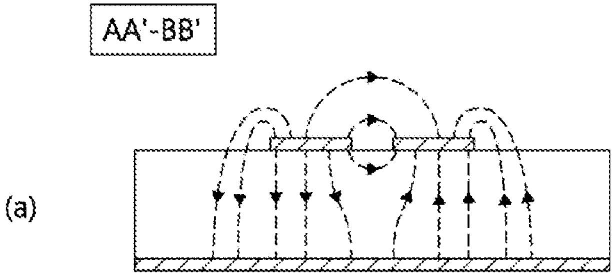
FIG. 14's (a) to (d) illustrate electric field distributions of the first to third regions formed in the transition structure according to the second embodiment.
Figure 14:
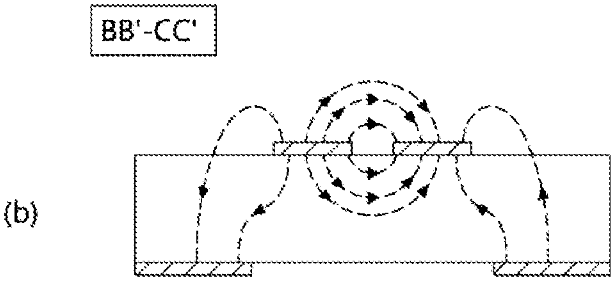
Figure 14:
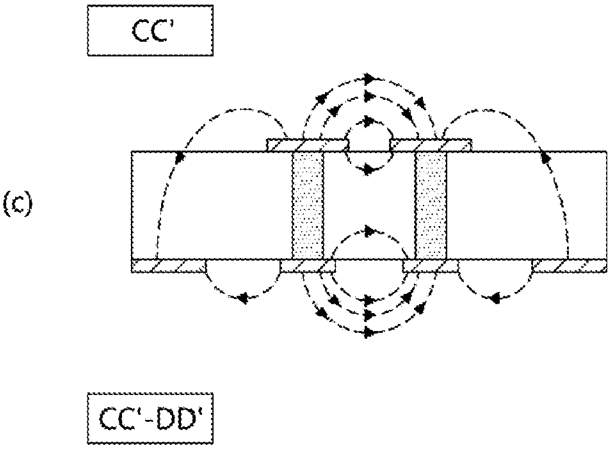
Figure 14:
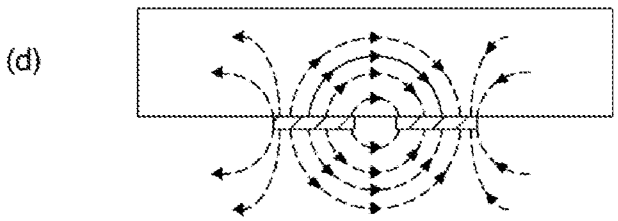

FIG. 14's (a) to (d) illustrate electric field distributions formed in the transition structure 200 according to the second embodiment. The electric field distributions may be represented by each region and, furthermore, may show an electric field distribution of a C-C' line region where extenders of the upper conductors 220 and 230 and the lower conductors 260 and 270 meet.

(a) of FIG. 14 illustrates the electric field distribution of the first region 10. Referring to (a) of FIG. 14, it can be seen that there are electric field lines that head to the lower ground 240 from the first upper conductor 220, electric field lines that head to the second upper conductor 230 from the lower ground 240, and electric field lines that connect the first upper conductor 220 and the second conductor 230. The electric field distribution is the same as the electric field distribution of the differential line in FIG. 2, as described above.

(b) of FIG. 14 illustrates the electric field distribution of the second region 20. Referring to (b) of FIG. 14B, there are electric field lines between the first upper conductor 220 and the second upper conductor 230, electric field lines that head to the first extender 241 of the lower ground 240 from the first upper conductor 220, and electric field lines that head to the second upper conductor 230 from the second extender 242 of the lower ground 240.

(c) of FIG. 14 illustrates an electric field distribution of a C-C' line, which is a boundary of the second region 20 and the third region 30. In the region, the upper conductors 220 and 230 and the lower conductors 260 and 270 are connected, respectively, through the vias 250, and the first and second extenders 241 and 242 are positioned at left/right sides of the first lower conductor 260 and the second lower conductor 270 due to the open region 243.

Referring to the electric field distribution, there are electric field lines that head to the second upper conductor 230 and the second lower conductor 270, which are the negative signal lines, from the first upper conductor 220 and the first lower conductor 260, which are the positive signal lines; electric field lines that head to the first extender 241 of the lower ground 240 from the positive signal lines 220 and 260; and electric field lines that head to the negative signal lines 230 and 270 from the second extender 242 of the lower ground 240.

(d) of FIG. 14 illustrates the electric field distribution of the third region 30. Referring to (d) of FIG. 14, in the third region 30, only the first lower conductor 260 and the second lower conductor 270 are present. It can be seen that the electric field lines are concentrated between the first lower conductor 260 and the second lower conductor 270. The electric field lines head to the second lower conductor 270 from the first lower conductor 260. The electric field distribution is the same as the electric field distribution of the first-type balanced line in FIG. 4A, as described above.

Figure 15:
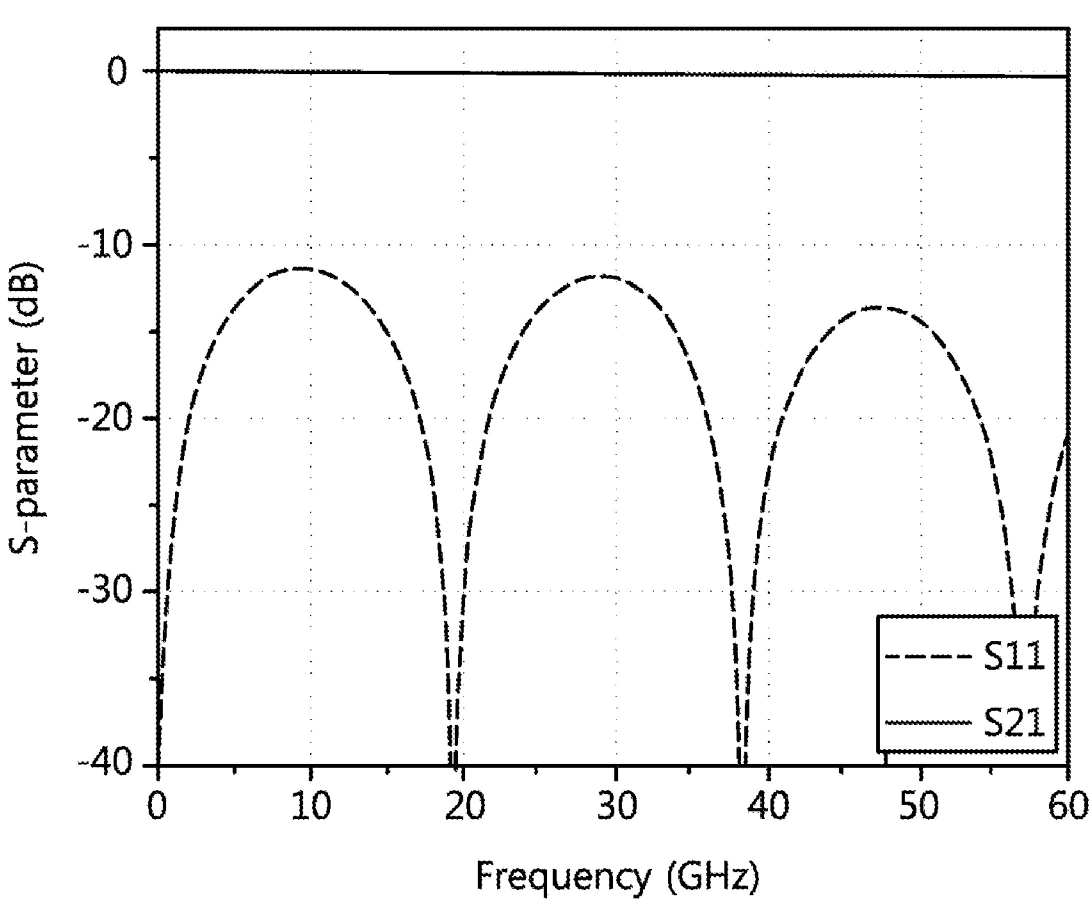
FIG. 15 is a frequency domain graph showing reflection loss S11 and insertion loss S21 of the transmission line when the transition structure of the second embodiment is applied.

FIG. 15 is a frequency domain graph showing reflection loss S11 and insertion loss S21 of the transmission line when the transition structure of the second embodiment is applied. Referring to FIG. 15, it can be seen that the frequency bandwidth is widely distributed up to 60 GHz, and the characteristics of the ultra-wideband may be confirmed.

Figure 16:
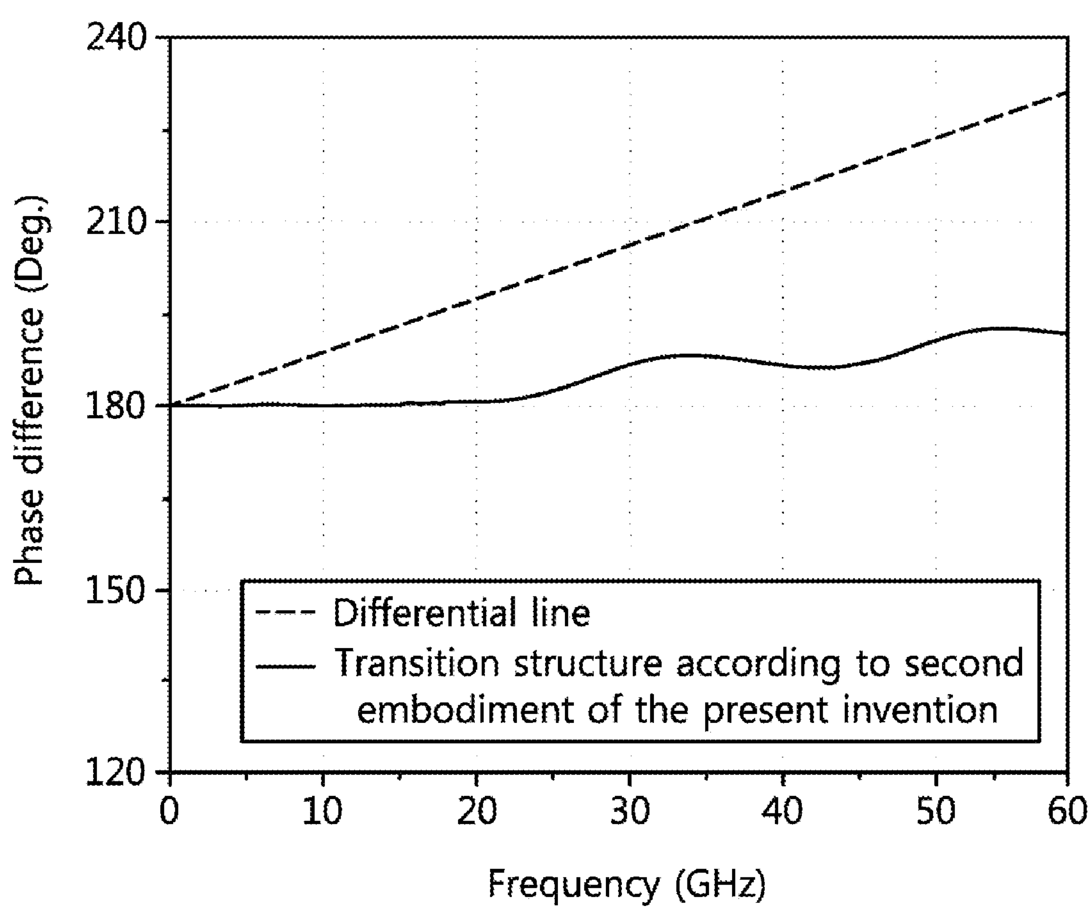
FIG. 16 is a frequency domain graph showing a phase difference when the differential line, where the line lengths of the positive signal line and the negative signal line are different, is connected to the transition structure of the second embodiment.

FIG. 16 is a frequency domain graph showing a phase difference when the differential line, where the line lengths of the positive signal line and the negative signal line are different, is connected to the transition structure of the second embodiment. The embodiment is a frequency domain graph when a transmission line is provided, which is disposed in the substrate with a relative permittivity of 2.2 and a height h of 0.254 mm, and there is a length difference of 0.508 mm between the positive signal line and the negative signal line. It can be seen that, also in the transition structure of the second embodiment, the phase difference between the positive signal line and the negative signal line is maintained around 180° due to the autonomous phase recovery characteristics of the balanced line.

Figure 17A:
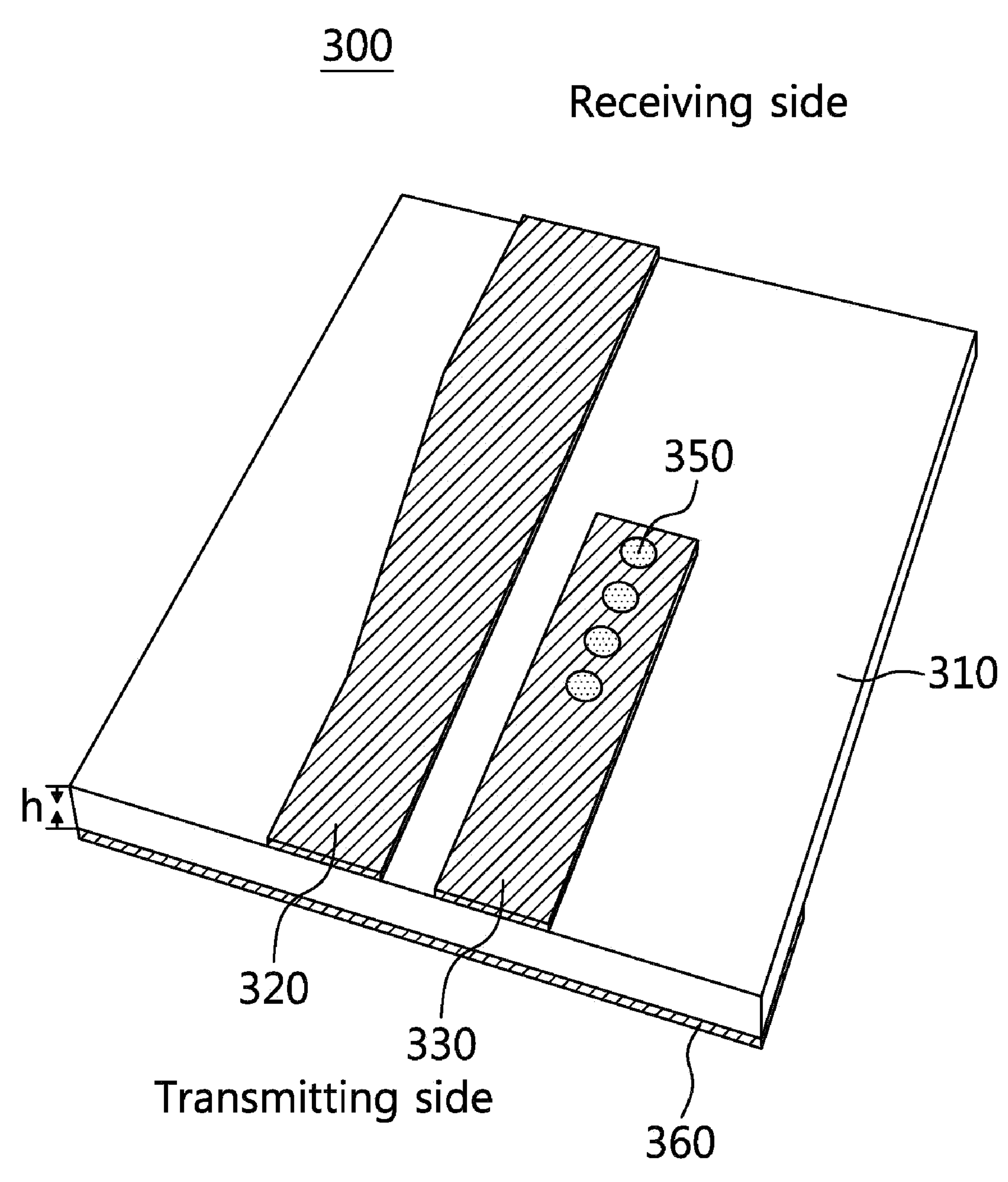

FIGS. 17A and 17B are perspective views illustrating a transition structure for digital signal transmission according to a third embodiment of the present invention.

As illustrated in FIGS. 17A and 17B, the transition structure 300 for digital signal transmission includes a substrate 310, a first upper conductor 320 and a second upper conductor 330 placed on top of the substrate 310, and a lower conductor 340 and a lower ground 360 placed on the bottom of the substrate 310. In the embodiment, the first upper conductor 320 may be the positive signal line, the second upper conductor 330 may be the negative signal line, and the lower conductor 340 may be the negative signal line. The substrate 310 is a dielectric substrate with a small dielectric loss. Of course, as shown in the embodiment, the FR4 based substrate may be used.

As shown in the embodiment, the widths Wd of the first upper conductor 320 and the second upper conductor 330 of the transmitting side (differential line) are selected to be smaller than the widths Wp of the first upper conductor 320 and the lower conductor 340 of the receiving side (balanced line). However, the widths (Wd and Wp) may vary depending on a choice of the impedance of the receiving side (balanced line), the type of substrate 310, and whether the dielectric body is present on an upper surface or a lower surface of the substrate 310.

The first upper conductor 320 and the second upper conductor 330 have opposite polarities and have different shapes. As illustrated in FIGS. 17A and 17B, the width of the first upper conductor 320 is changed to be larger in the propagation direction of the digital signal. That is, the width at the transmitting side is Wd, while the width at the receiving side Wp becomes larger than Wd. On the contrary, the second upper conductor 330 is formed only up to approximately the middle point of the substrate 310 and has a constant width. The first upper conductor 320 and the second upper conductor 330 are spaced apart from each other by a predetermined gap distance gd.

The lower conductor 340 is placed in parallel to overlap the first upper conductor 320 and has an extender 341 for connection with the second upper conductor 330. There is a structure in which the extender 341 of the lower conductor 340 is connected to the second upper conductor 330 through at least one via 350.

The lower ground 360 includes first and second extenders 361 and 362 on the left and right sides thereof. A central region is formed as an opening region 363 due to the first and second extenders 361 and 362.

Figure 18:
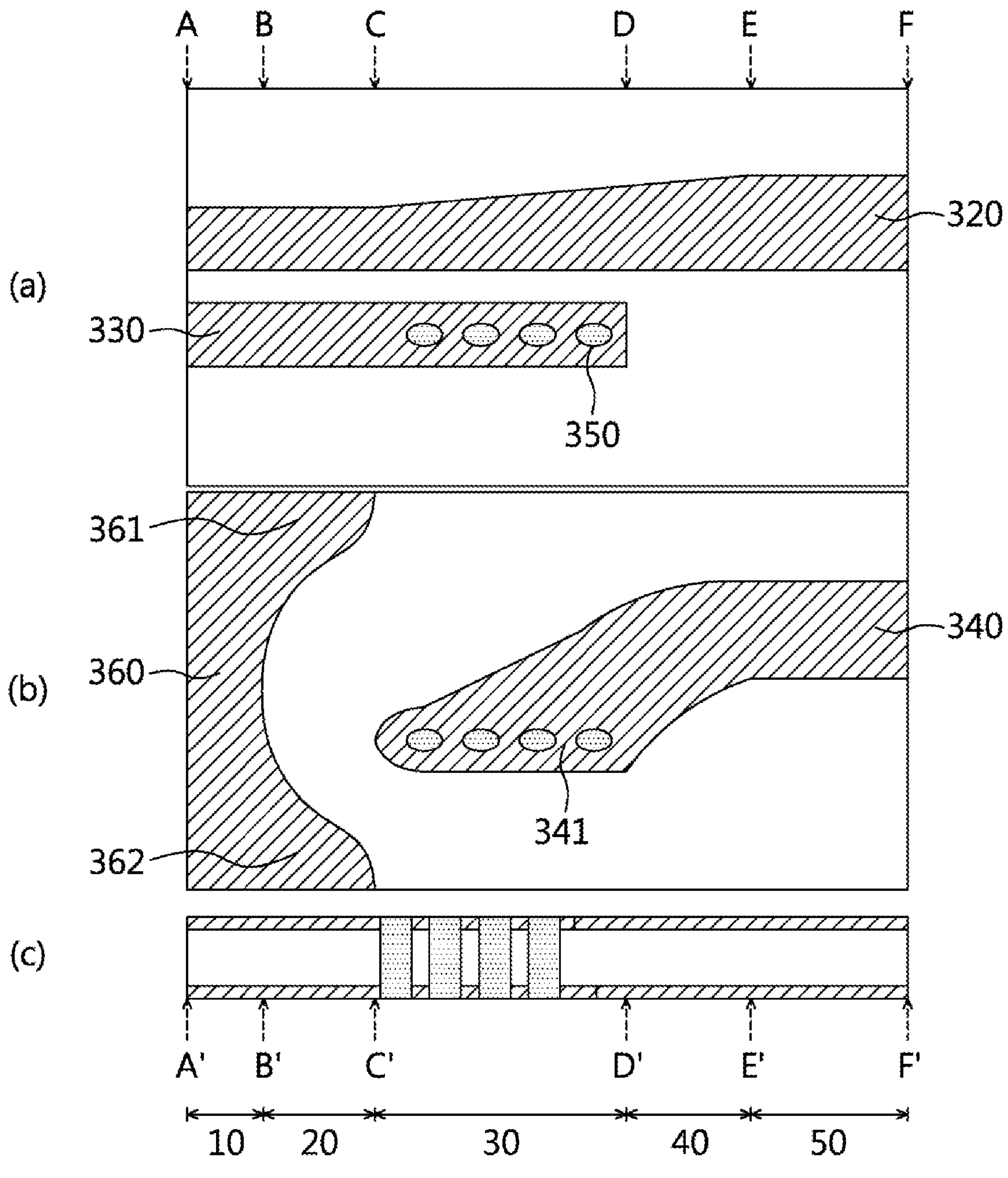
FIG. 18 is a diagram illustrating the respective locations of upper and lower conductors, a via, and a lower ground, respectively, based on the dielectric substrate to be compared.

FIG. 18 is a diagram illustrating the respective locations of the first upper conductor 320, the second upper conductor 330, and the lower conductor 340, the vias 350 connecting the second upper conductor 330 and the lower conductor 340, and the lower ground 360, respectively, based on the dielectric substrate.

As illustrated in FIG. 18, the transition structure 300 of the third embodiment may be divided into a first region 10, a second region 20, a third region 30, a fourth region 40, and a fifth region 50. The first region 10 is a region where the first upper conductor 320, the second upper conductor 330, and the lower ground 360 are all positioned. The second region 20 is a region where the first upper conductor 320, the second upper conductor 330, and the first and second extenders 361 and 362 of the lower ground 360 are positioned. The third region 30 is a region where the first upper conductor 320, the second upper conductor 330, the extender 341 of the lower conductor 340, and the vias 350 are positioned. The fourth region 40 and the fifth region 50 are regions where the first upper conductor 320 and the lower conductor 340 are positioned.

Referring to FIG. 18, it can be seen that the width of the first upper conductor 320 becomes larger in the third region 30 and the fourth region 40. Therefore, the first upper conductor 320 has the largest width in the fifth region 50, rather than the first and second regions 10 and 20. Further, a shape is provided in which the first and second extenders 361 and 362 of the lower ground 360, and the extender 341 of the lower conductor 340 do not overlap, and the extender 341 of the lower conductor 340 is placed to face an opening region 363 of the lower ground 360. In addition, four vias 350 are illustrated, but the number of vias 350 may be smaller or larger according to the length of the third region 30. The second upper conductor 330 and the lower conductor 340 are electrically connected, and the first upper conductor 320 and the lower conductor 340 thus constitute the balanced line.

Figure 19:
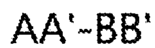
FIGS. 19 to 20 illustrate electric field distributions of the first to fifth regions formed in the transition structure according to the third embodiment.
Figure 19:
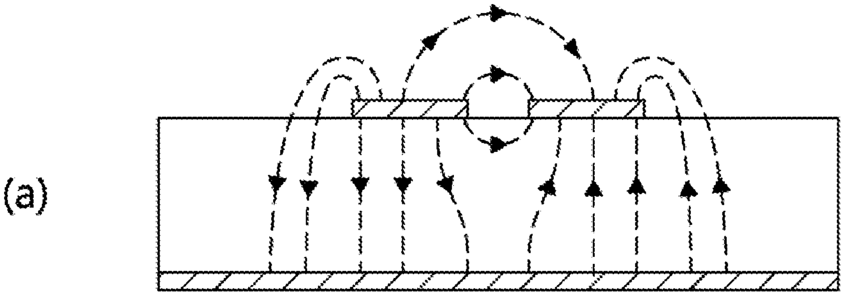
Figure 19:
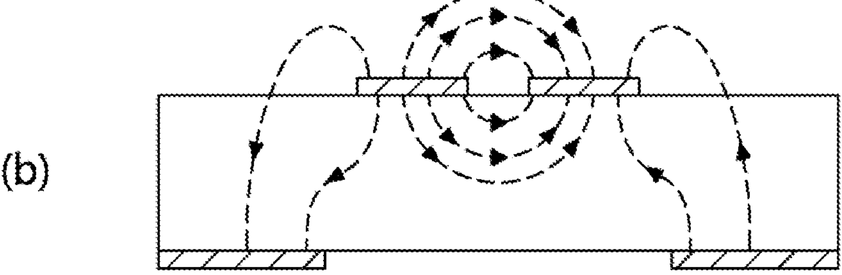
Figure 19:
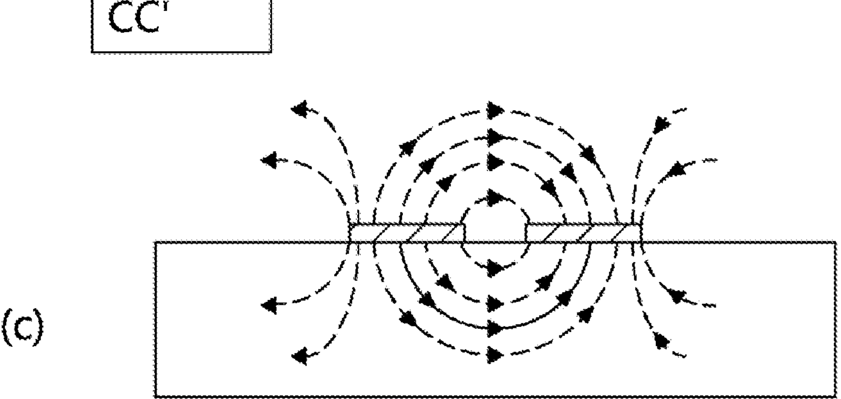
Figure 20:
Figure 20:
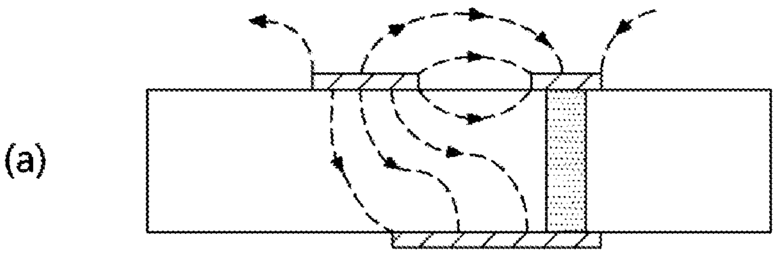
Figure 20:
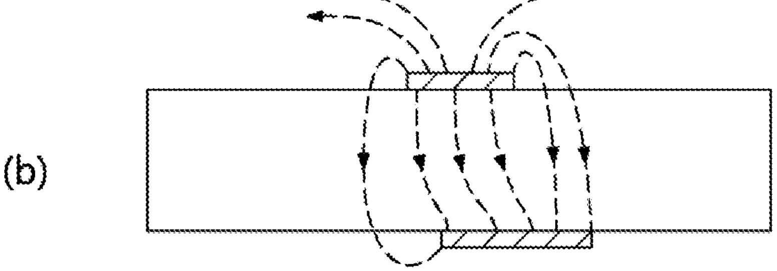
Figure 20:
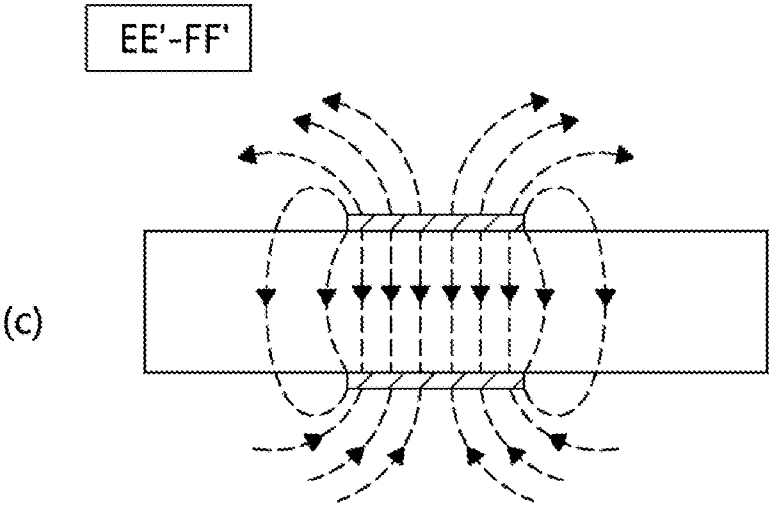

FIGS. 19 to 20 illustrate electric field distributions of the transition structure 300 according to the third embodiment. The electric field distributions may be represented by each region and, furthermore, may show an electric field distribution of a C-C' line region where the extender of the lower ground and the extender of the lower conductor meet.

(a) of FIG. 19 illustrates the electric field distribution of the first region 10. Referring to (a) of FIG. 19, it can be seen that there are electric field lines that head to the lower ground 360 from the first upper conductor 320, electric field lines that head to the second upper conductor 330 from the lower ground 360, and electric field lines that connect the first upper conductor 320 and the second conductor 330. The electric field distribution is the same as the electric field distribution of the differential line in FIG. 2, as described above.

(b) of FIG. 19 illustrates the electric field distribution of the second region 20. Referring to (b) of FIG. 19, there are electric field lines between the first upper conductor 320 and the second upper conductor 330, electric field lines that head to the first extender 361 of the lower ground 360 from the first upper conductor 320, and electric field lines that head heads to the second upper conductor 330 from the second extender 362 of the lower ground 360.

(c) of FIG. 19 illustrates an electric field distribution of a C-C' line, which is a boundary of the second region 20 and the third region 30. In the region, since only the first upper conductor 320 and the second upper conductor 330 are placed, only electric field lines that head to the second upper conductor 330 from the first upper conductor 320 is present. The electric field lines are concentrated between the first upper conductor 320 and the second upper conductor 330. The electric field distribution is the same as the electric field distribution of the first-type balanced line in FIG. 4A, as described above.

(a) of FIG. 20 illustrates the electric field distribution of the third region 30. In the third region 30, the first upper conductor 320, the second upper conductor 330, and the extender 341 of the lower conductor 340 are positioned. The lower ground is not present. Accordingly, there is partial electric field lines that head to the second upper conductor 330 from the first upper conductor 320. In addition, there are also electric field lines that head to the extender 341 of the lower conductor 340 from the first upper conductor 320.

(b) of FIG. 20 illustrates the electric field distribution of the fourth region 40. In the fourth region 40, the first upper conductor 320 and the lower conductor 340 are positioned, but the lower conductor 340 is formed to be larger than the first upper conductor 320 due to the extender 341 of the lower conductor 340. Electric field lines that head to the lower conductor 340 from the first upper conductor 320 are present. In this case, it will be preferable that the width of the lower conductor 340 be formed in the form of an optimal impedance taper to minimize the reflection of a propagating signal.

(c) of FIG. 20 illustrates the electric field distribution of the fifth region 50. The first upper conductor 320 and the lower conductor 340 are positioned in parallel. Electric field lines that head to the lower conductor 340 from the first upper conductor 320 are present. The electric field distribution is the same as the electric field distribution of the second-type balanced line in FIG. 6A, as described above.

Figure 21:
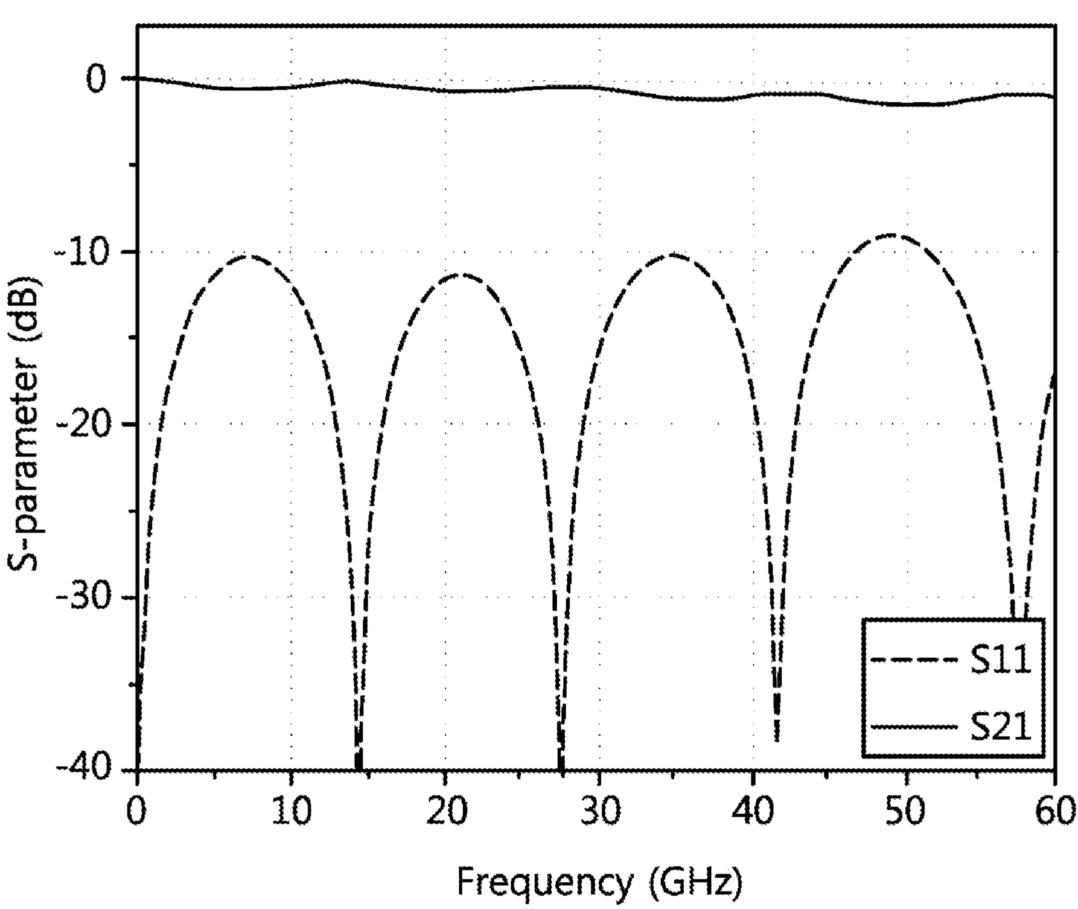
FIG. 21 is a frequency domain graph showing reflection loss S11 and insertion loss S21 of the transmission line when the transition structure of the third embodiment is applied.

FIG. 21 is a frequency domain graph showing reflection loss S11 and insertion loss S21 of the transmission line when the transition structure of the third embodiment is applied. Referring to FIG. 21, it can be seen that the frequency bandwidth is widely distributed up to 60 GHz, and the characteristics of the ultra-wideband may be confirmed.

Figure 22:
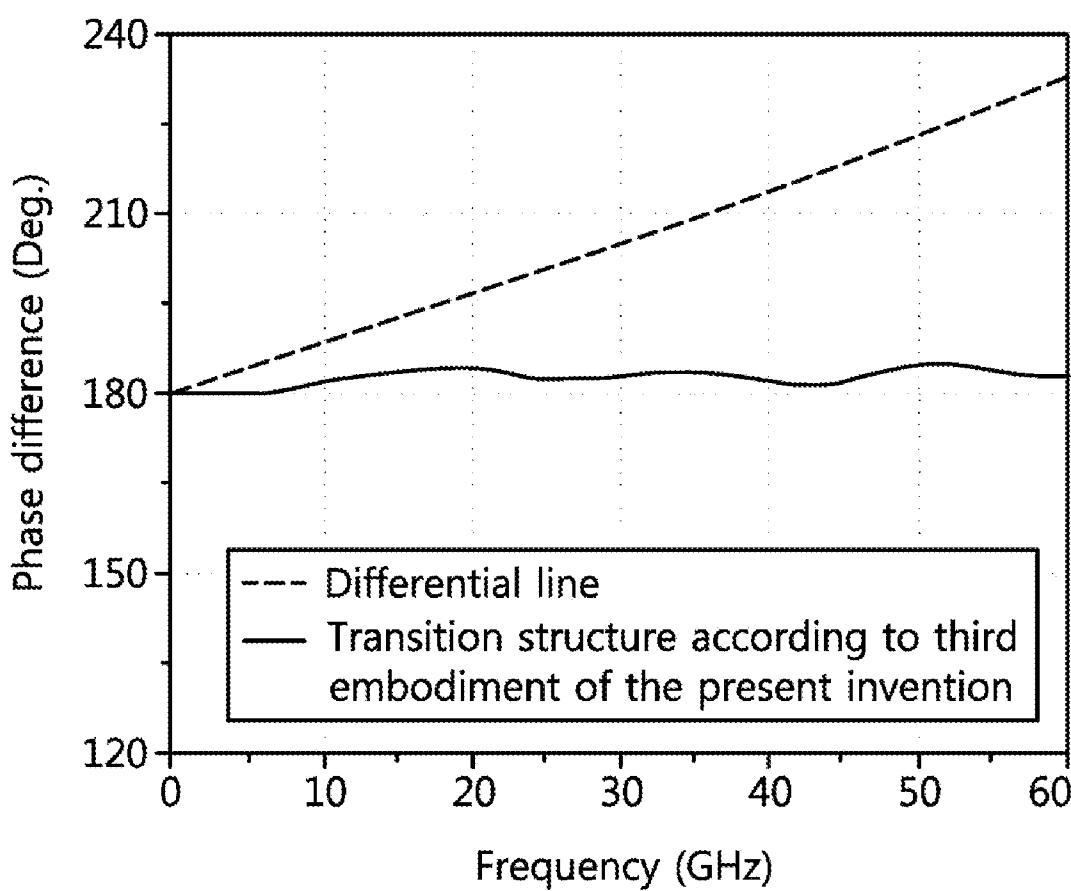
FIG. 22 is a frequency domain graph showing a phase difference when the differential line, where the line lengths of the positive signal line and the negative signal line are different, is connected to the transition structure of the third embodiment.

FIG. 22 is a frequency domain graph showing a phase difference when the differential line, where the line lengths of the positive signal line and the negative signal line are different, is connected to the transition structure of the third embodiment. The embodiment is a frequency domain graph when a transmission line is provided, which is disposed in the substrate with a relative permittivity of 2.2 and a height h of 0.254 mm, and there is a length difference of 0.508 mm between the positive signal line and the negative signal line. Referring to FIG. 22, it can be seen that, also in the transition structure of the third embodiment, the phase difference between the positive signal line and the negative signal line is maintained around 180° due to the autonomous phase recovery characteristics of the balanced line.

Figure 23A:
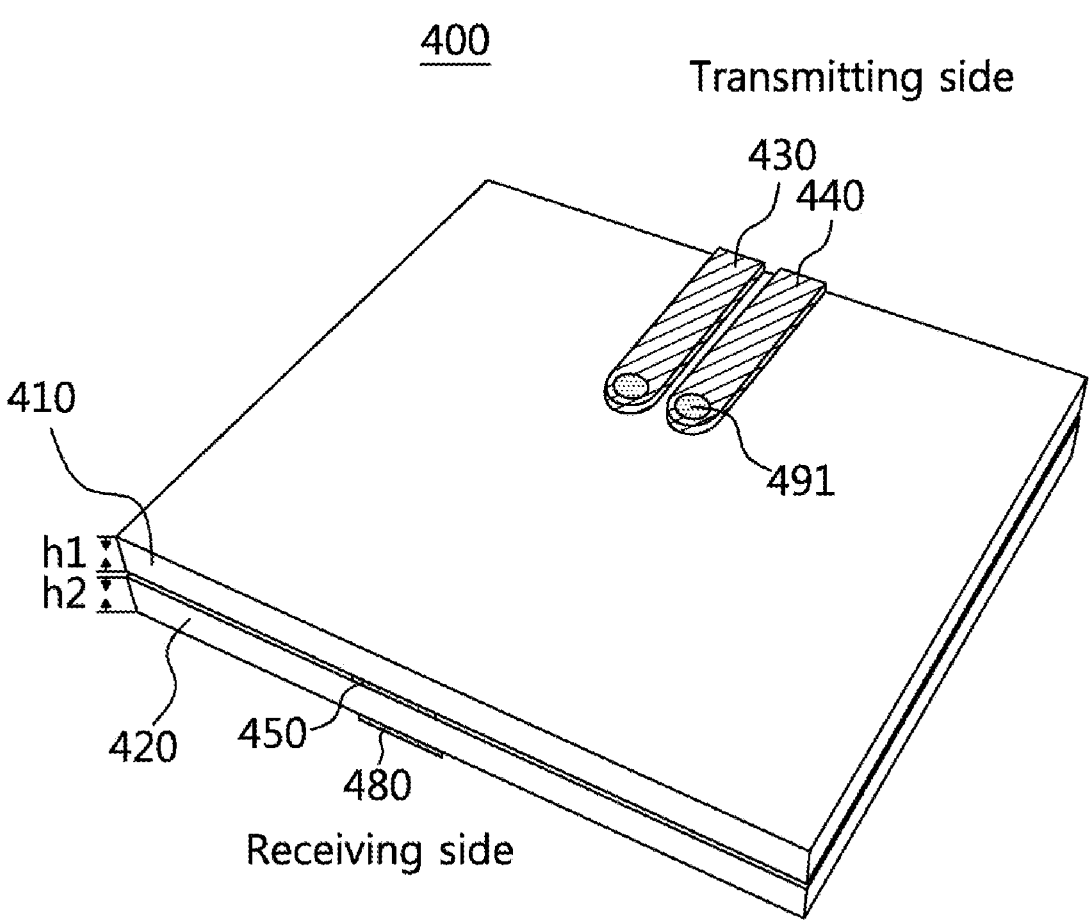

FIGS. 23A and 23B are perspective views illustrating a transition structure for digital signal transmission according to a fourth embodiment of the present invention. As illustrated in FIGS. 23A and 23B, the transition structure 400 for digital signal transmission includes a first substrate 410 having a height of h1 and a second substrate 420 having a height of h2 below the first substrate 410. In the embodiment, the heights of the first substrate 410 and the second substrate 420 are equal to each other, but other embodiments in which the heights of the respective substrates are different are also available.

In the first substrate 410, a first upper conductor 430 and a second upper conductor 440 having predetermined widths are placed to be spaced apart from each other by a predetermined gap distance g. In the embodiment, the first upper conductor 430 may be the positive signal line, and the second upper conductor 440 may be the negative signal line.

As shown in the embodiment, the widths Wd of the first upper conductor 430 and the second upper conductor 440 of the transmitting side (differential line) are selected to be smaller than the widths Wp of the first intermediate conductor 450 and the lower conductor 480 of the receiving side (balanced line). However, the widths (Wd, Wc, Wp) may vary depending on a choice of the impedance of the receiving side (balanced line), the type of substrate, and whether the dielectric body is present on the upper or lower surfaces of substrates 410 and 420.

The first intermediate conductor 450 and a second intermediate conductor 460 are placed between the first substrate 410 and the second substrate 420 and to be spaced apart from each other with a predetermined gap distance. The first upper conductor 430 and the first intermediate conductor 450, and the second upper conductor 440 and the second intermediate conductor 460, are placed in parallel to each other. The width of the first intermediate conductor 450 has different widths Wc and Wp, and the width of the second intermediate conductor 460 is constant. The first upper conductor 430 and the first intermediate conductor 450, and the second upper conductor 440 and the second intermediate conductor 460 are connected, respectively, through vias 491 while the ends of the respective conductors overlap each other in longitude direction.

In addition, an intermediate ground 470 is placed between the first substrate 410 and the second substrate 420. The intermediate ground 470 includes first and second extenders 471 and 472 on the left and right sides thereof. A central region is formed as an opening region 473 due to the first and second extenders 471 and 472.

The lower conductor 480 is placed on the bottom of the second substrate 420.

An extender 481 of the lower conductor 480 is connected to the second intermediate conductor 460 through at least one via 492. The lower conductor 480 is placed in parallel to the first intermediate conductor 450 and has a curved shape to connect the extender 481 to the second intermediate conductor 460.

Figure 24:
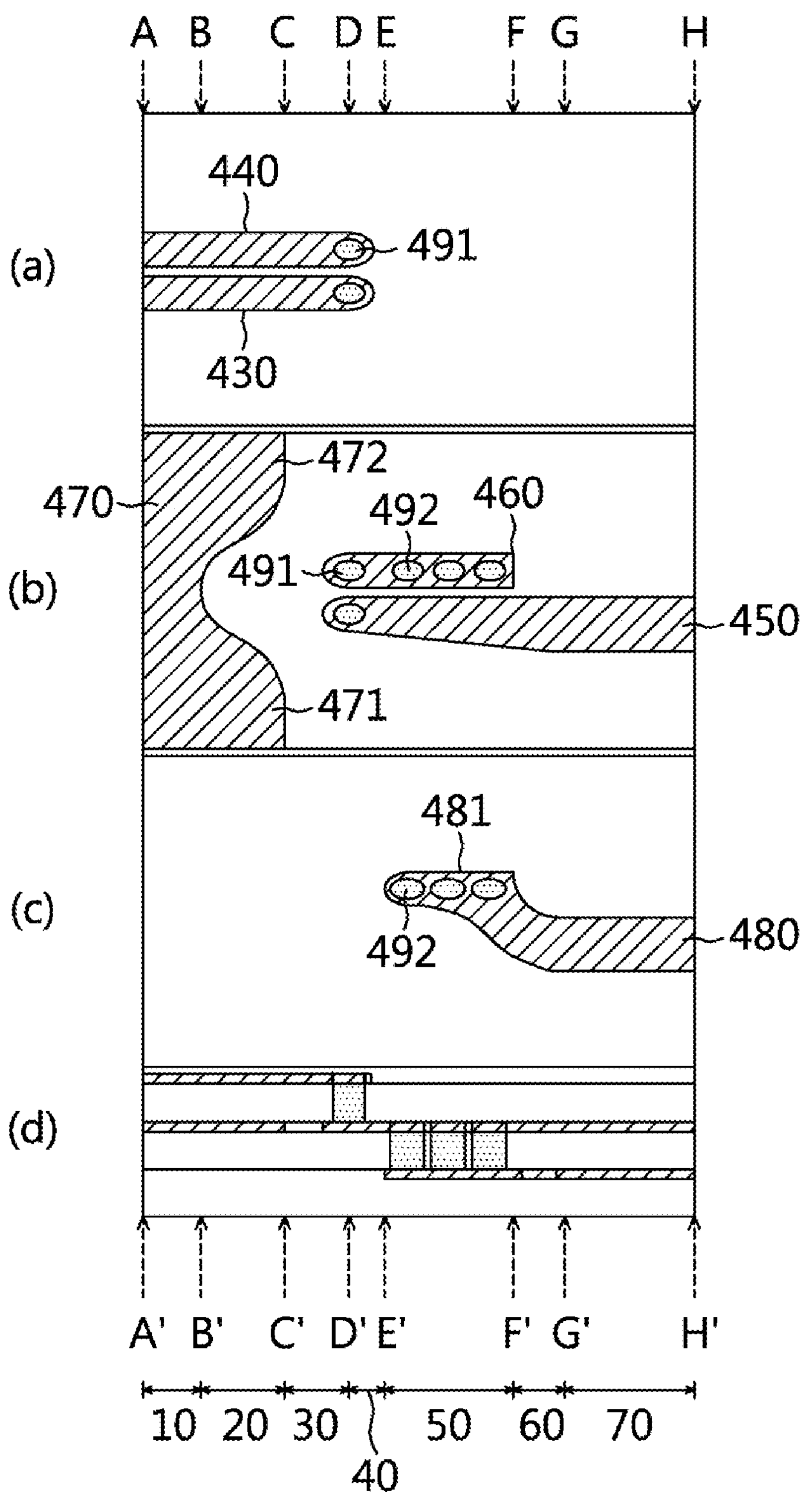
FIG. 24 is a diagram illustrating the respective locations of an upper conductor, an intermediate conductor, and a lower conductor, and a via and an intermediate ground connecting the upper conductor, the intermediate conductor, and the lower conductor, respectively based on the dielectric substrate to be compared.

FIG. 24 is a diagram illustrating the respective locations of upper conductors, intermediate conductors, and a lower conductor, vias connecting the upper conductors, the intermediate conductors, and the lower conductor, and an intermediate ground, respectively, based on the dielectric substrate.

As illustrated in FIG. 24, the transition structure of the fourth embodiment may be divided into the first to seventh regions 10 to 70.

The first region 10 is a region where upper conductors 430 and 440 and an intermediate ground 470 are positioned.

The second region 20 is a region where the upper conductors 430 and 440 and extenders 471 and 472 of the intermediate ground 470 are positioned.

The third region 30 is a region where only the upper conductors 430 and 440 are positioned.

In FIG. 24, it is illustrated that vias 491 are formed on the boundary of the third region 30 and the fourth region 40.

The fourth region 40 is a region where only the intermediate conductors 450 and 460 are positioned.

The fifth region 50 is a region where the intermediate conductors 450 and 460 and the extender 481 of the lower conductor 480 are positioned. The second intermediate 460 and the extender 481 are connected through at least one via 492.

The sixth region 60 and the seventh region 70 are regions where the first intermediate conductor 450 and the lower conductor 480 are positioned.

In FIG. 24, the fourth region 40 is positioned between the first via 491 and the second via 492. The first via 491 refers to vias for connecting the upper conductors 430 and 440 and the intermediate conductors 450 and 460, and the second via 492 refers to at least one via for connecting the second intermediate conductor 460 and the lower conductor 480. In addition, three second vias 492 are illustrated, but the number of second vias 492 may be smaller or larger according to the length of the fifth region.

Figure 25:
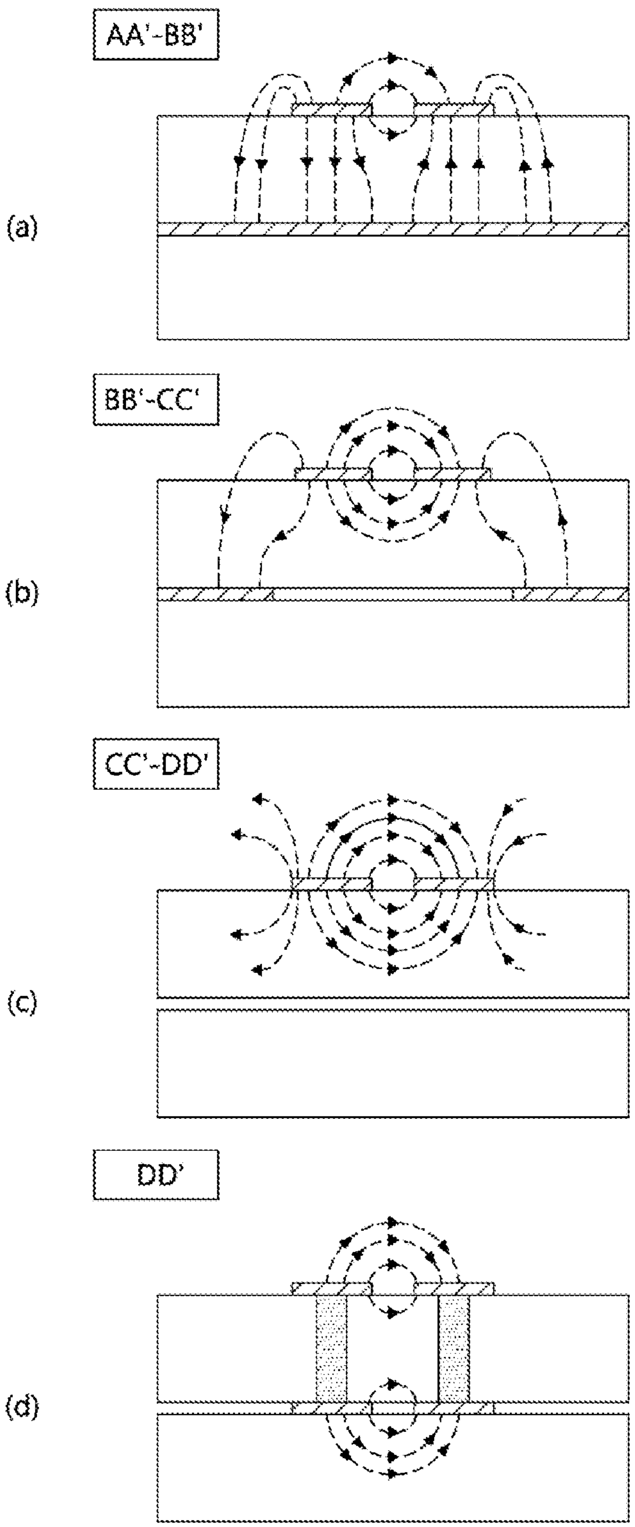
FIGS. 25 to 26 illustrate electric field distributions of the first to seventh regions formed in the transition structure according to the fourth embodiment. The electric field distributions are described for each region.
Figure 26:
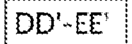
Figure 26:
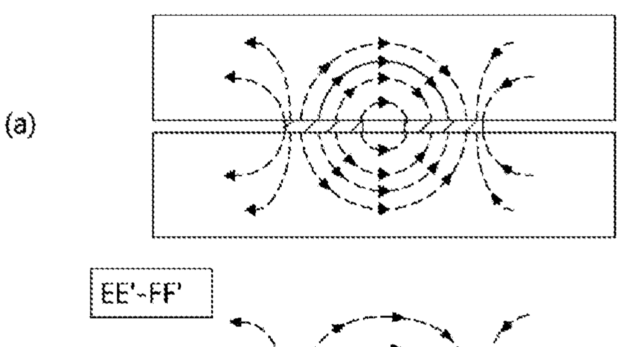
Figure 26:
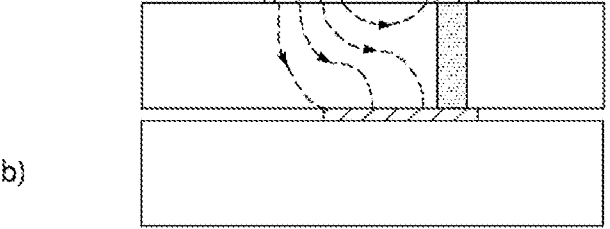
Figure 26:
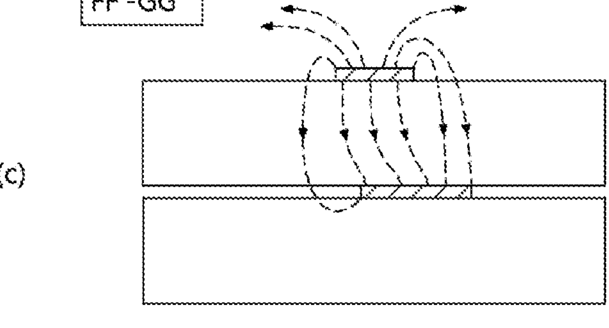
Figure 26:
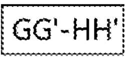
Figure 26:
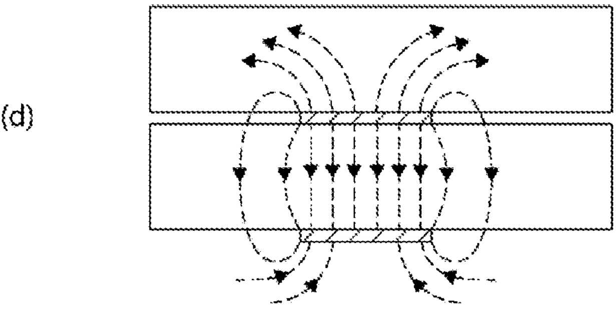

FIGS. 25 to 26 illustrate electric field distributions of the transition structure according to the fourth embodiment. The electric distributions are described for each region.

(a) of FIG. 25 illustrates the electric field distribution of the first region 10. Referring to (a) of FIG. 25, there are electric field lines connecting the first upper conductor 430 and the second upper conductor 440, electric field lines that head to the intermediate ground 470 from the first upper conductor 430, and electric field lines that head to the second upper conductor 440 from the intermediate ground 470.

(b) of FIG. 25 illustrates the electric field distribution of the second region 20. There are electric field lines connecting the first upper conductor 430 and the second upper conductor 440, electric field lines that head to the first extender 471 from the first upper conductor 430, and electric field lines that head to the second upper conductor 440 from the second extender 472.

(c) of FIG. 25 illustrates the electric field distribution of the third region 30. Only the first upper conductor 430 and the second upper conductor 440 are placed, and only electric field lines that head to the second upper conductor 440 from the first upper conductor 430 is present. The electric field distribution is the same as the electric field distribution of the first-type balanced line in FIG. 4A, as described above.

(d) of FIG. 25 illustrates an electric field distribution of a D-D' line, which is a boundary of the third region 30 and the fourth region 40. There are vias 491 connecting upper conductors and intermediate conductors. Accordingly, the first upper conductor 430 and the first intermediate conductor 450, which are the positive signal lines, and the second upper conductor 440 and the second intermediate conductor 460, which are the negative signal lines, are connected, respectively, through the vias 491, and electric field lines that head to the negative signal lines from the positive signal lines are present.

(a) of FIG. 26 illustrates the electric field distribution of the fourth region 40. Only the first intermediate conductor 450 and the second intermediate conductor 460 are present, and only electric field lines that head to the second intermediate conductor 460 from the first intermediate conductor 450 are present.

(b) of FIG. 26 illustrates the electric field distribution of the fifth region 50. The fifth region 50 is a region where the first intermediate conductor 450 and the second intermediate conductor 460 are placed, and the second intermediate conductor 460 and the lower conductor 480 are connected through one or more vias 492. Accordingly, electric field lines that head to the second intermediate conductor 460 and the lower conductor 480 from the first intermediate conductor 450 are present.

(c) of FIG. 26 illustrates the electric field distribution of the sixth region 60. In the sixth region 60, the first intermediate conductor 450 and the lower conductor 480 are positioned, but the lower conductor 480 is formed to be larger than the first intermediate conductor 450 due to the extender 481 of the lower conductor 480. An electric field lines that head to the lower conductor 480 from the first intermediate conductor 450 are present.

(d) of FIG. 26 illustrates the electric field distribution of the seventh region 70. The first intermediate conductor 450 and the lower conductor 480 have the same width, are placed to be in parallel to each other, and are connected by electric field lines that head to the lower conductor 480 from the first intermediate conductor 450.

Figure 27:
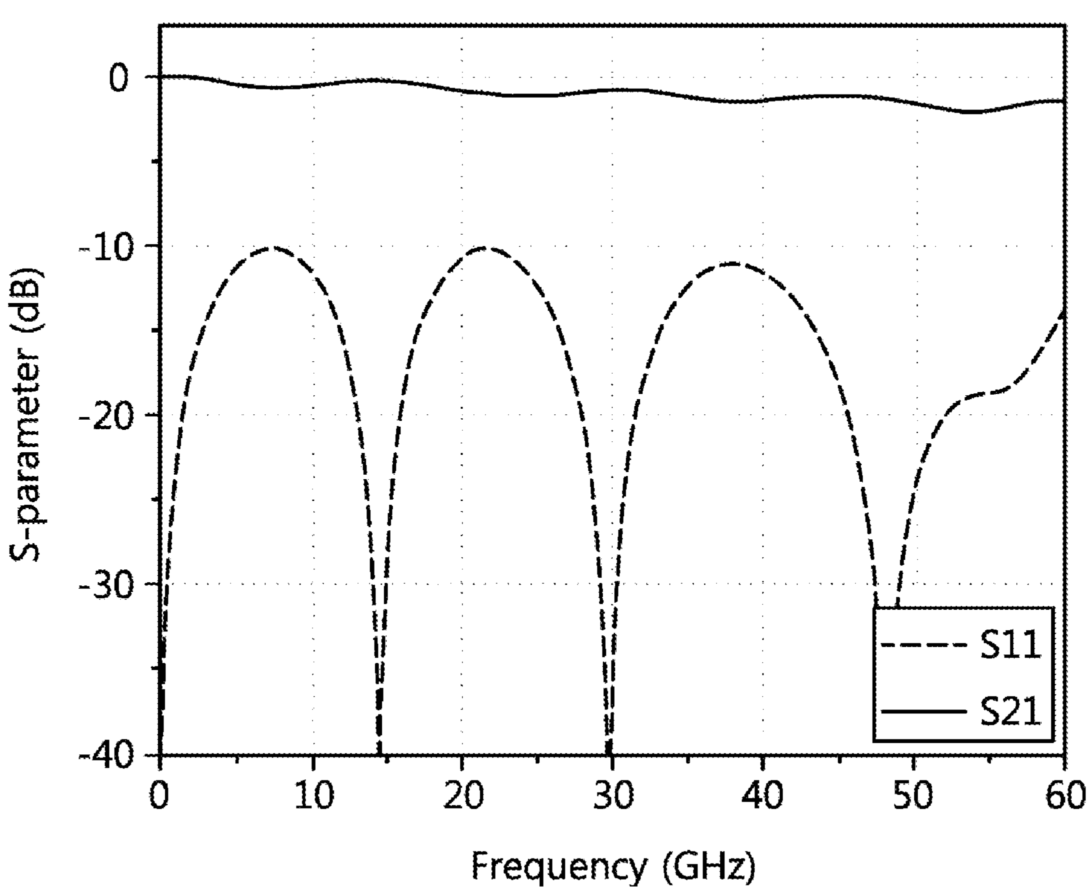
FIG. 27 is a frequency domain graph showing reflection loss S11 and insertion loss S21 of the transmission line when the transition structure of the fourth embodiment is applied.

FIG. 27 is a frequency domain graph showing reflection loss S11 and insertion loss S21 of the transmission line when the transition structure of the fourth exemplary embodiment is applied. Referring to FIG. 27, it can be seen that the frequency bandwidth is widely distributed up to 60 GHz, and the characteristics of the ultra-wideband may be confirmed.

Figure 28:
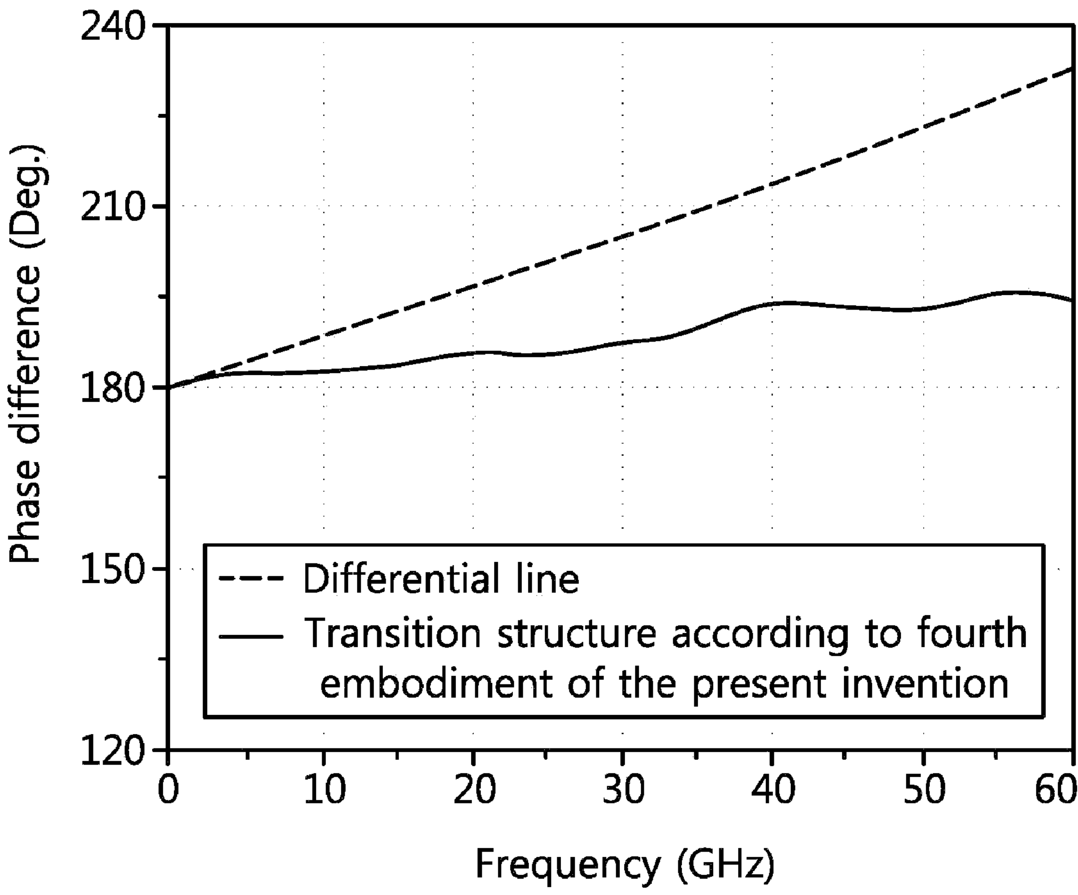
FIG. 28 is a frequency domain graph showing a phase difference when the differential line, where the line lengths of the positive signal line and the negative signal line are different, is connected to the transition structure of the fourth embodiment.

FIG. 28 is a frequency domain graph showing a phase difference when the differential line, where the line lengths of the positive signal line and the negative signal line are different, is connected to the transition structure of the fourth embodiment. The exemplary embodiment is a frequency domain graph when a transmission line is provided, which is disposed in the substrate, which has a relative permittivity of 2.2 and a height h of 0.254 mm, and there is a length difference of 0.508 mm between the positive signal line and the negative signal line. Referring to FIG. 28, it can be seen that also in the transition structure of the fourth exemplary embodiment, the phase difference between the positive signal line and the negative signal line is maintained around 180° due to the autonomous phase recovery characteristics of the balanced line.

The digital transmission line structure of the present invention is also compatible with the existing general digital transmission line. Two types of transmission line structures are provided to be applied to the existing general digital circuit board. A first-type is a stack-type transmission line structure, and a second-type is a pocket-type transmission line structure.

Figure 29:
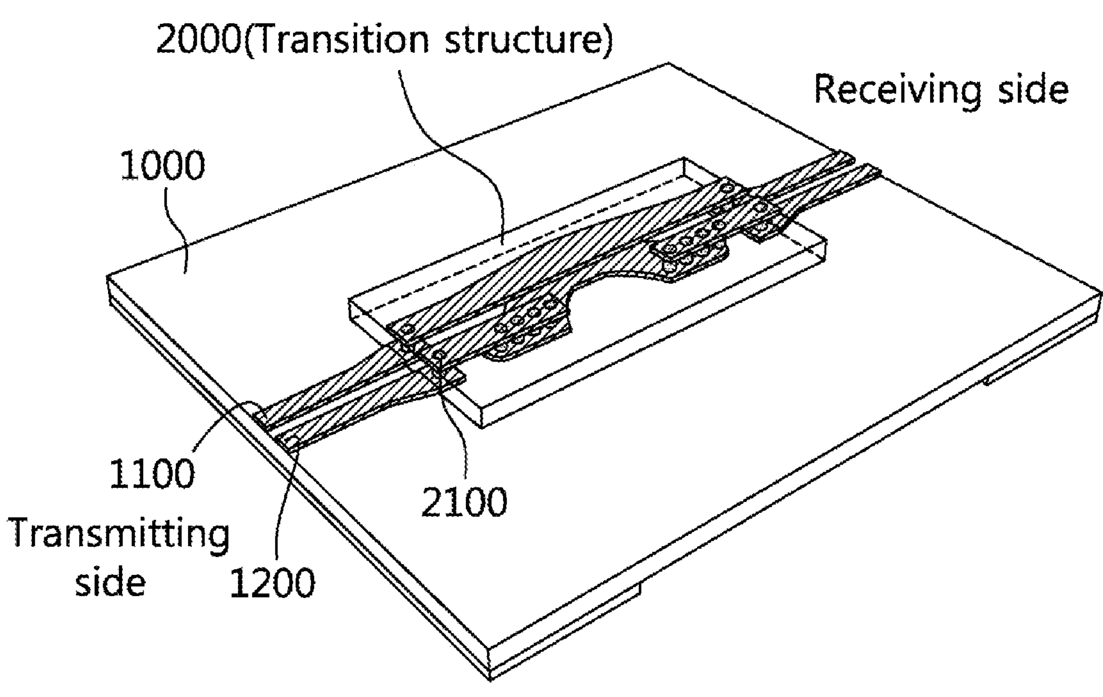
FIG. 29 is a diagram illustrating a stack-type transmission line structure according to the present invention.

FIG. 29 is a diagram illustrating a stack-type transmission line structure according to the present invention. Referring to FIG. 29, the stack-type transmission line structure includes a first substrate 1000 with the differential line and a second substrate 2000 (the transition structure of the present invention) for ultra-high-speed signal transmission. In the exemplary embodiment, the first substrate 1000 is a dielectric substrate of a generally used FR4 substrate, and the second substrate 2000 is a dielectric substrate having a smaller loss than the first substrate 1000. However, any dielectric substrate other than FR4 may be used as the first substrate 1000 and the second substrate 2000.

The second substrate 2000 is provided to connect differential lines 1100 and 1200 formed in the first substrate 1000.

The transition structure of the present invention may be placed in the second substrate 2000, and the transition structure may be one of the transition structures in the first to fourth exemplary embodiments described above. In addition, the transition structures of the present invention may be placed in the transmitter and the receiver in reverse order to be connected to correspond to a differential line of the digital signal transmitter and a differential line of the receiver. In FIG. 29, it is illustrated that the transition structure of the third exemplary embodiment is provided.

The differential lines 1100 and 1200 of the first substrate 1000 and the balanced line of the second substrate 2000 may be connected through vias 2100 formed in the second substrate 2000.

Figure 30:
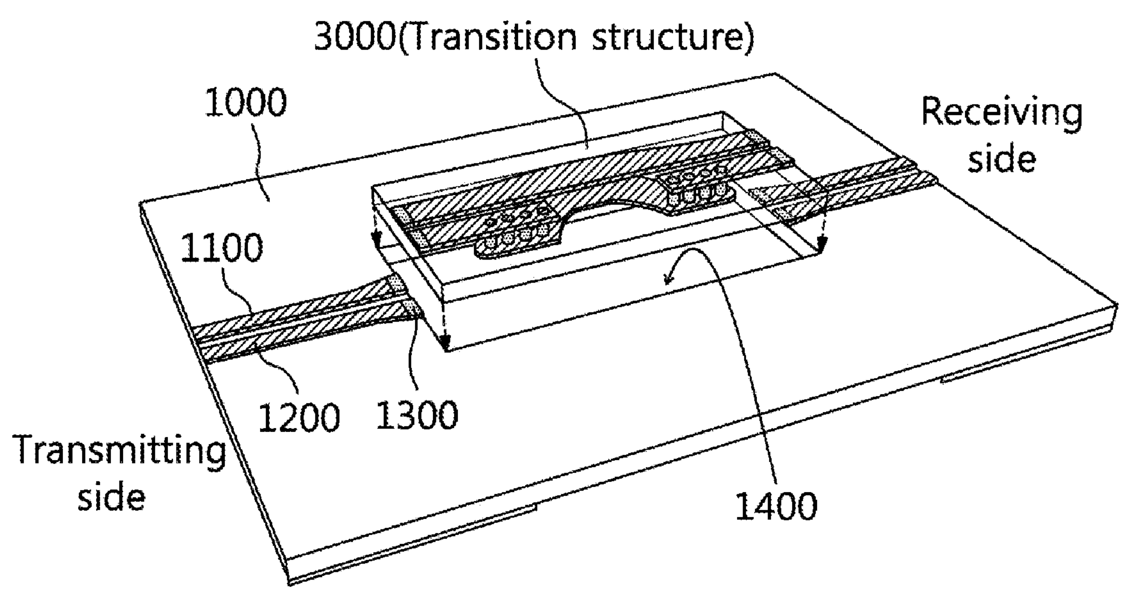
FIG. 30 is a diagram illustrating a pocket-type transmission line structure according to the present invention.

FIG. 30 is a diagram illustrating a pocket-type transmission line structure according to the present invention. The pocket-type transmission line structure of FIG. 30 also adopts the first substrate 1000 with the differential lines 1100 and 1200 similar to the stack-type transmission line structure. However, a mounting groove 1400 is formed in the first substrate 1000 to apply a second substrate 3000 (the transition structure of the present invention) to the first substrate 1000. The second substrate 3000 is inserted and mounted into the mounting groove 1400. The transition structure of the present invention may be placed in the second substrate 3000, and the transition structure may be one of the transition structures in the first to fourth exemplary embodiments described above. In addition, the transition structures of the present invention may be placed in the transmitter and the receiver in reverse order to be connected to correspond to a differential line of the digital signal transmitter and a differential line of the receiver. In FIG. 30, it is illustrated that the transition structure of the third exemplary embodiment is provided.

The differential lines 1100 and 1200 of the first substrate 1000 and the balanced line of the second substrate 3000 may be connected by forming connecting pads 1300 at a position where the differential lines 1100 and 1200 and the line of the transition structure are in contact with each other.

While the above has been described with reference to the illustrated embodiments of the invention, they are exemplary only, and it will be apparent to one having ordinary skill in the art to which the invention belongs that various modifications, changes, and equivalents are possible without departing from the spirit and scope of the invention. The true scope of technical protection of the invention should therefore be determined by the technical ideas of the appended claims.

INDUSTRIAL APPLICABILITY

The disclosure may be utilized for transmission lines, general digital circuit boards, high-speed chips that transmit digital signals, and similar things at very high speeds.

What is claimed is:

1. A transition structure for digital signal transmission, converting a differential line comprising two lines having opposite polarities into a balanced line while preserving a form of a differential signal, the transition structure including the differential line and the balanced line comprising:

a dielectric substrate with a predetermined height;

a first upper conductor and a second upper conductor disposed on top of the dielectric substrate and having the opposite polarities; and a lower ground on the bottom of the dielectric substrate, wherein the differential signal is transmitted while maintaining a phase difference between a positive polarity and a negative polarity in a vicinity of 180°.

2. The transition structure of claim 1, wherein each of the first upper conductor and the second upper conductor comprises:

a fore-end strip;

a rear-end strip having a width and a gap distance according to an impedance of a balanced line; and a connection strip connecting the fore-end strip and the rear-end strip.

3. The transition structure of claim 2, wherein the lower ground comprises a first extender and a second extender, and the first upper conductor and the second upper conductor are positioned within an opening region between the first extender and the second extender along a direction from the differential line to the balanced line.

4. The transition structure of claim 3, further comprising:

a first region is a region where the fore-end strip of the first upper conductor, the fore-end strip of the second upper conductor, and the lower ground are positioned;

a second region is a region where the connection strips extend from each of the fore-end strips, and the first extender and the second extender of the lower ground are positioned; and a third region is a region where the rear-end strips are positioned and extend from the connection strips, wherein the first to third regions have different electric field distributions, and widths of the first upper conductor, the second upper conductor, and the lower ground are determined such that characteristic impedances calculated from the electric field distributions in the first to third regions and a permittivity of the dielectric substrate have values corresponding to the impedance matching of the transition structure.

5. The transition structure of claim 4, further comprising:

a first lower conductor and a second lower conductor connected to the first upper conductor and the second upper conductor through vias, respectively, wherein the first lower conductor and the second lower conductor are arranged to face the lower ground on which the first extender and the second extender are formed on the bottom of the dielectric substrate.

6. The transition structure of claim 5, wherein the first lower conductor and the second lower conductor are disposed with a predetermined width and spaced apart from each other with a predetermined gap distance according to an impedance of the balanced line.

7. A transition structure for digital signal transmission, converting a differential line comprising two lines having opposite polarities into a balanced line while preserving a form of a differential signal, the transition structure including the differential line and the balanced line comprising:

a dielectric substrate with a predetermined height;

a first upper conductor and a second upper conductor disposed on top of the dielectric substrate and having the opposite polarities;

a lower conductor connected to the second upper conductor on the bottom of the dielectric substrate and placed in parallel to the first upper conductor in a vertical direction; and a lower ground on the bottom of the dielectric substrate, wherein the differential signal is transmitted while maintaining a phase difference between a positive polarity and a negative polarity in a vicinity of 180°.

8. The transition structure of claim 7, wherein the second upper conductor and the lower conductor are connected through at least one via.

9. The transition structure of claim 7, wherein the first upper conductor and the lower conductor have a width according to an impedance of a balanced line.

10. The transition structure of claim 7, further comprising:

a first region is a region where the first upper conductor, the second upper conductor, and the lower ground are positioned;

a second region is a region where the first upper conductor, the second upper conductor, and a first extender and a second extender of the lower ground are positioned;

a third region is a region where the first upper conductor, the second upper conductor, an extender of the lower conductor, and one or more vias are positioned; and fourth region and fifth region on which the first upper conductor and the lower conductor are positioned, wherein the first to fifth regions have different electric field distributions, and widths of the first upper conductor, the second upper conductor, the lower conductor, and the lower ground are determined such that characteristic impedances calculated from the electric field distributions in the first to fifth regions and a permittivity of the dielectric substrate have values corresponding to the impedance matching of the transition structure.

11. A transition structure for digital signal transmission, comprising a first dielectric substrate and a second dielectric substrate, and converting a differential line comprising two lines having opposite polarities into a balanced line while preserving a form of a differential signal, the transition structure including the differential line and the balanced line comprising:

a first upper conductor and a second upper conductor disposed on top of the first dielectric substrate and having the opposite polarities;

a first intermediate conductor and a second intermediate conductor are connected between the first upper conductor and the first dielectric substrate and between the second upper conductor and the second dielectric substrate, respectively, through vias;

an intermediate ground disposed between the first dielectric substrate and the second dielectric substrate; and a lower conductor disposed on the bottom of the second dielectric substrate, connected to the second intermediate conductor, and disposed in parallel to the first intermediate conductor in a vertical direction, wherein the differential signal is transmitted while maintaining a phase difference between a positive polarity and a negative polarity in a vicinity of 180°.

12. The transition structure of claim 11, wherein the intermediate ground comprises a first extender and a second extender, and the first upper conductor and the second upper conductor are positioned within an opening region between the first extender and the second extender along a direction from the differential line to the balanced line.

13. The transition structure of claim 11, wherein the first intermediate conductor and the second intermediate conductor are connected to the first upper conductor and the second upper conductor, respectively, through vias, and the first intermediate conductor and the second intermediate conductor are arranged between the first dielectric substrate and the second dielectric substrate to face the intermediate ground on which the first extender and the second extender are formed.

14. The transition structure of claim 11, wherein the second intermediate conductor and the lower conductor are connected to each other through at least one via.

15. The transition structure of claim 11, wherein the second intermediate conductor and the lower conductor have a width according to an impedance of the balanced line.

16. The transition structure of claim 11, further comprising:

a first region is a region where the first upper conductor, the second upper conductor, and the intermediate ground are positioned;

a second region is a region where the first upper conductor, the second upper conductor, and a first extender and a second extender of the intermediate ground are positioned;

a third region is a region where the first upper conductor and the second upper conductor are positioned;

a fourth region is a region where the first intermediate conductor and the second intermediate conductor are positioned;

a fifth region on which the first intermediate conductor, the second intermediate conductor, an extender of the lower conductor, and one or more vias connecting the second intermediate conductor and the extender are positioned;

sixth region and seventh region are regions where the first intermediate conductor and the lower conductor are positioned; and vias formed on a boundary of the third region and the fourth region, wherein the first to seventh regions have different electric fields, and widths of the first upper conductor, the second upper conductor, the first intermediate conductor, the second intermediate conductor, the lower conductor, and the intermediate ground are determined such that characteristic impedance calculated from the electric field distributions in the first to seventh regions and a permittivity of the dielectric substrate has a value corresponding to the impedance matching of the transition structure.

* * * * *